United States Patent [19]

Reed et al.

[11] Patent Number: 4,720,798

[45] Date of Patent: Jan. 19, 1988

[54] PROCESS FOR USE IN RAPIDLY PRODUCING PRINTED CIRCUIT BOARDS USING A COMPUTER CONTROLLED PLOTTER

[75] Inventors: Ronald G. Reed; John T. Rasper, both of Colorado Springs, Colo.

[73] Assignee: ProtoCAD, Inc., Colorado Springs, Colo.

[21] Appl. No.: 725,817

[22] Filed: Apr. 16, 1985

[51] Int. Cl.⁴ .............................................. B05C 5/02
[52] U.S. Cl. ................................. 364/489; 156/659.1; 118/410; 340/140 R
[58] Field of Search .............................. 364/488–491, 364/475, 559; 356/399–401; 156/901, 625, 659.1; 318/567; 346/140 R; 118/401, 410

[56] References Cited

U.S. PATENT DOCUMENTS

| | | | |
|---|---|---|---|
| 3,653,072 | 3/1972 | Ballas et al. | 364/300 |
| 3,881,098 | 4/1975 | Rich | 364/490 |
| 3,961,599 | 6/1976 | Jones, Jr. | 346/140 R |
| 4,093,990 | 6/1978 | Koller et al. | 364/520 |
| 4,157,936 | 6/1979 | Piazza | 156/659 |
| 4,422,083 | 12/1983 | Neumann et al. | 346/108 |
| 4,485,387 | 11/1984 | Drumheller | 364/489 X |
| 4,571,072 | 2/1986 | Bourbeau, Jr. et al. | 355/79 |
| 4,588,468 | 5/1986 | McGinty | 159/345 |
| 4,601,777 | 7/1986 | Hawkins et al. | 156/626 |
| 4,610,756 | 9/1986 | Strobel | 156/645 |

Primary Examiner—Errol A. Krass
Assistant Examiner—Thomas G. Black
Attorney, Agent, or Firm—John R. Ley

[57] ABSTRACT

A conductor clad board from which the printed circuit board is produced is operatively retained for manipulation in a plotter controlled by a computer. Etchant-resist material is laid down in a printed circuit conductor pattern on at least one conductive sheet of the board by a marking instrument operatively manipulated by the plotter. The computer controls the application of the resist material in accordance with printed circuit board computer aided design information in the computer memory. Both conductive sheets of the board can be marked with resist after establishing the orientation of the board so the printed circuit patterns on opposite sides of the board occupy a predetermined aligned relationship. After etching, the board is again retained in the plotter and holes are drilled through the board by using drill apparatus operatively adapted for use and manipulation by the plotter.

55 Claims, 14 Drawing Figures

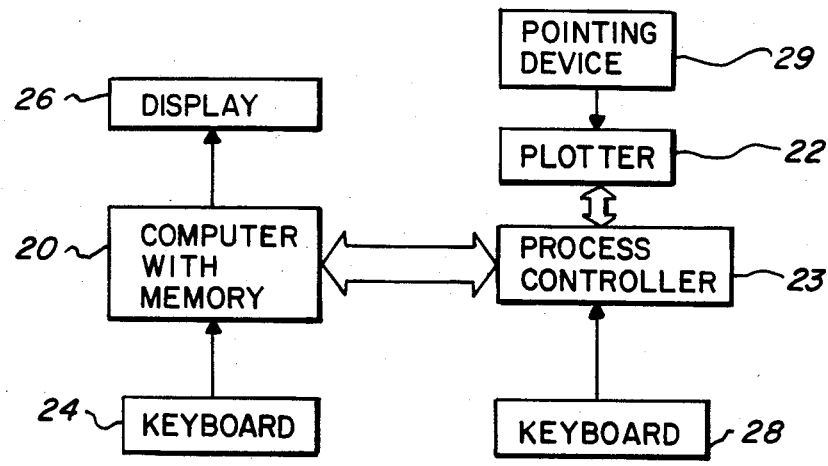
Fig_1
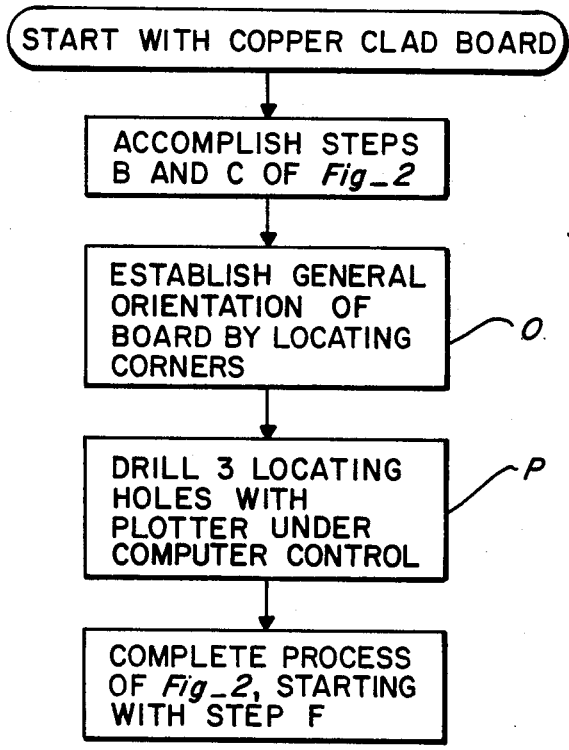
Fig_3

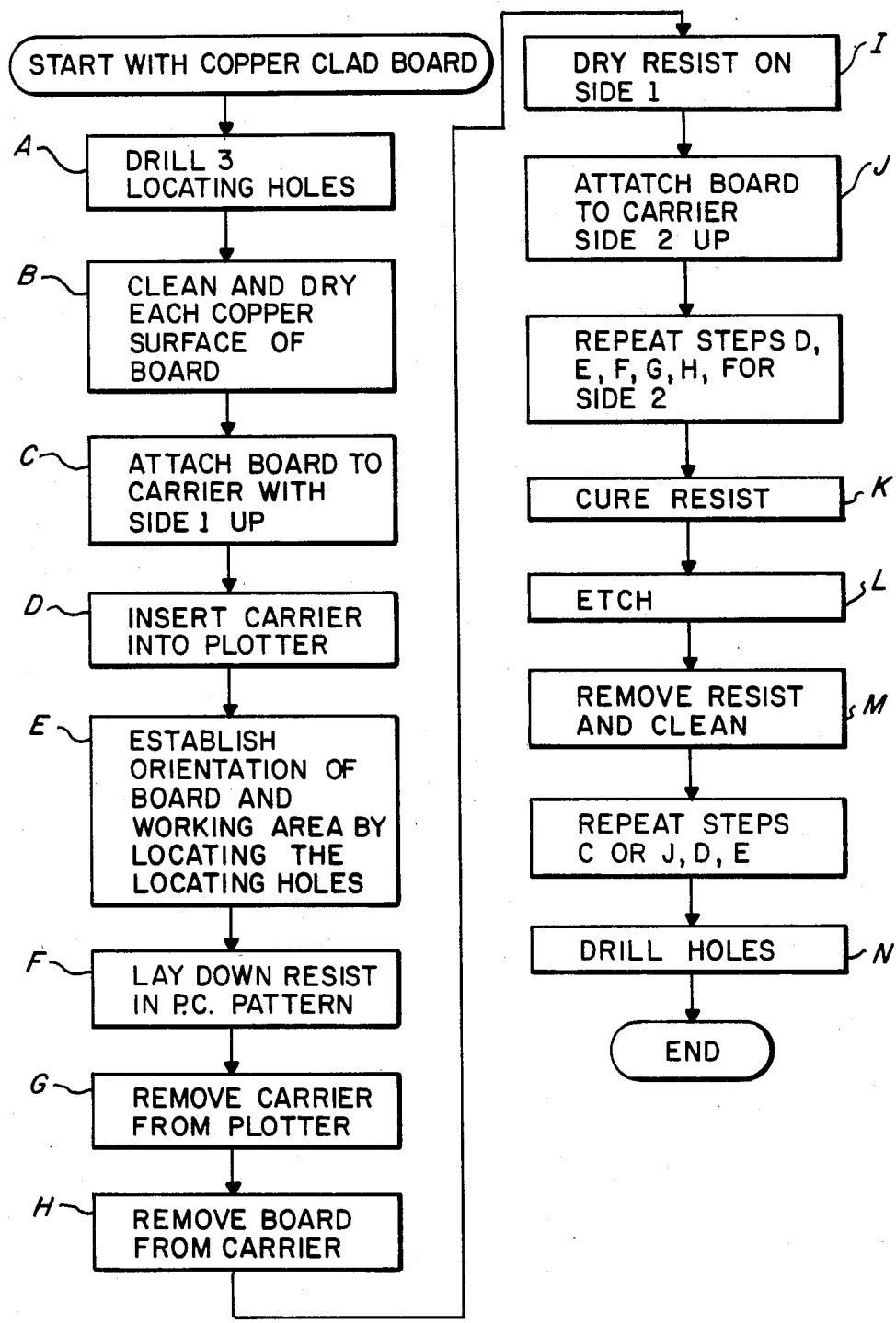
Fig_2

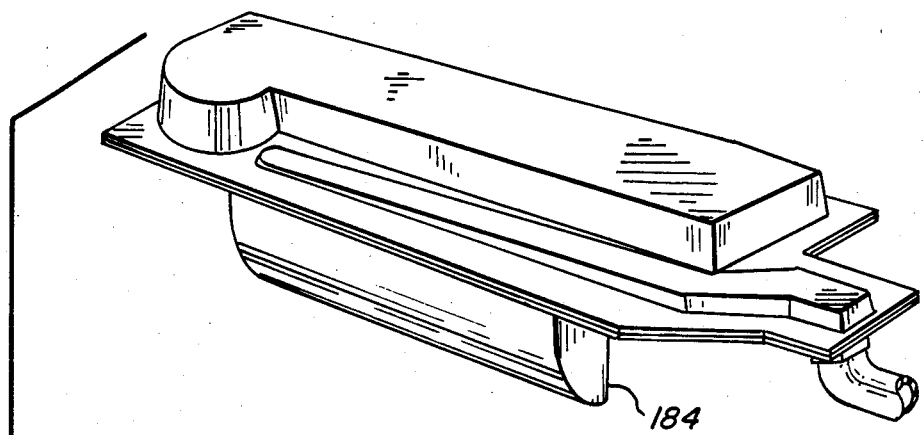
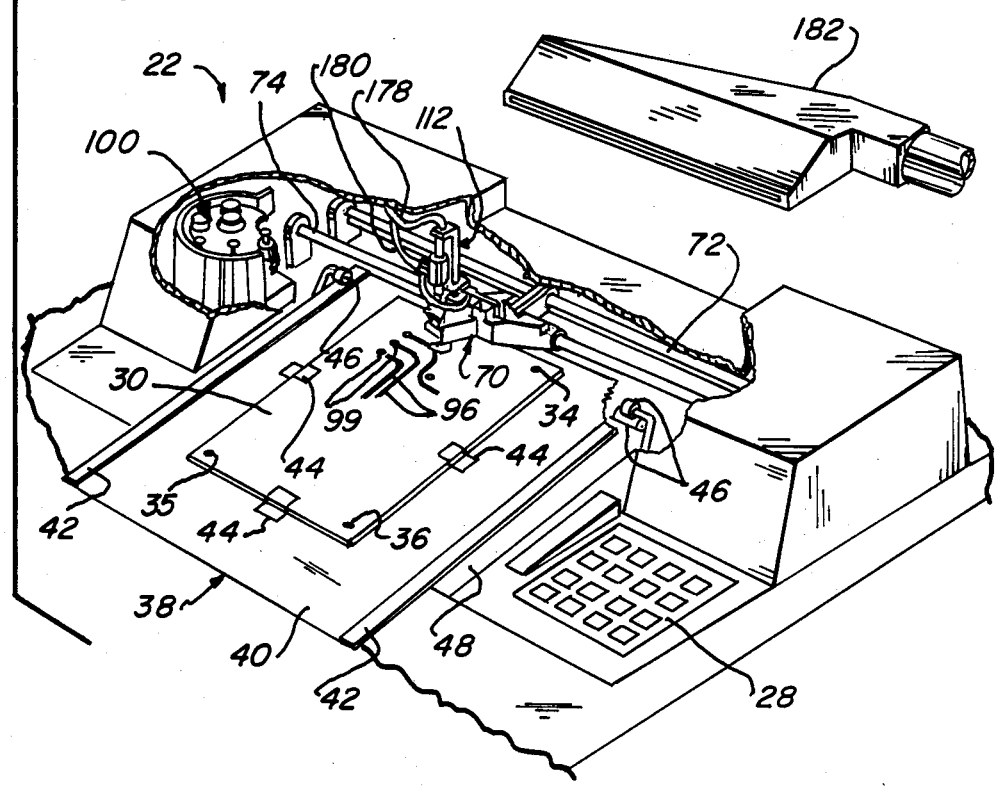
Fig_4

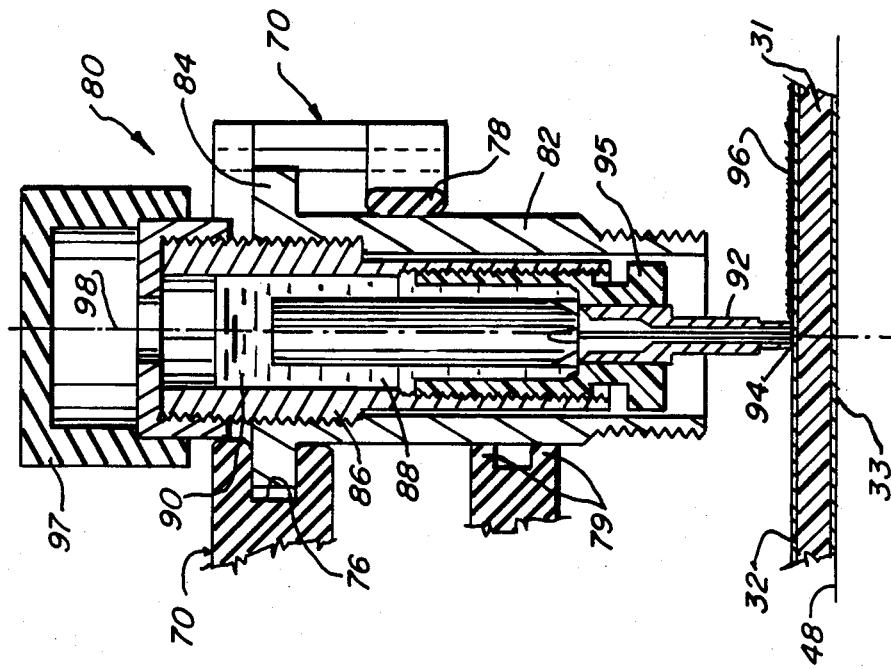
Fig_6
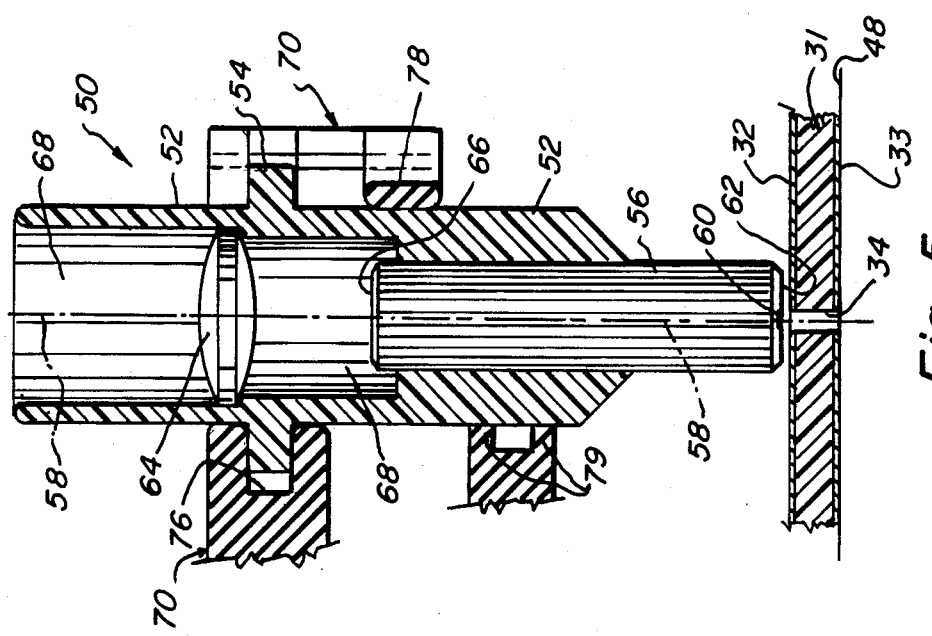
Fig_5

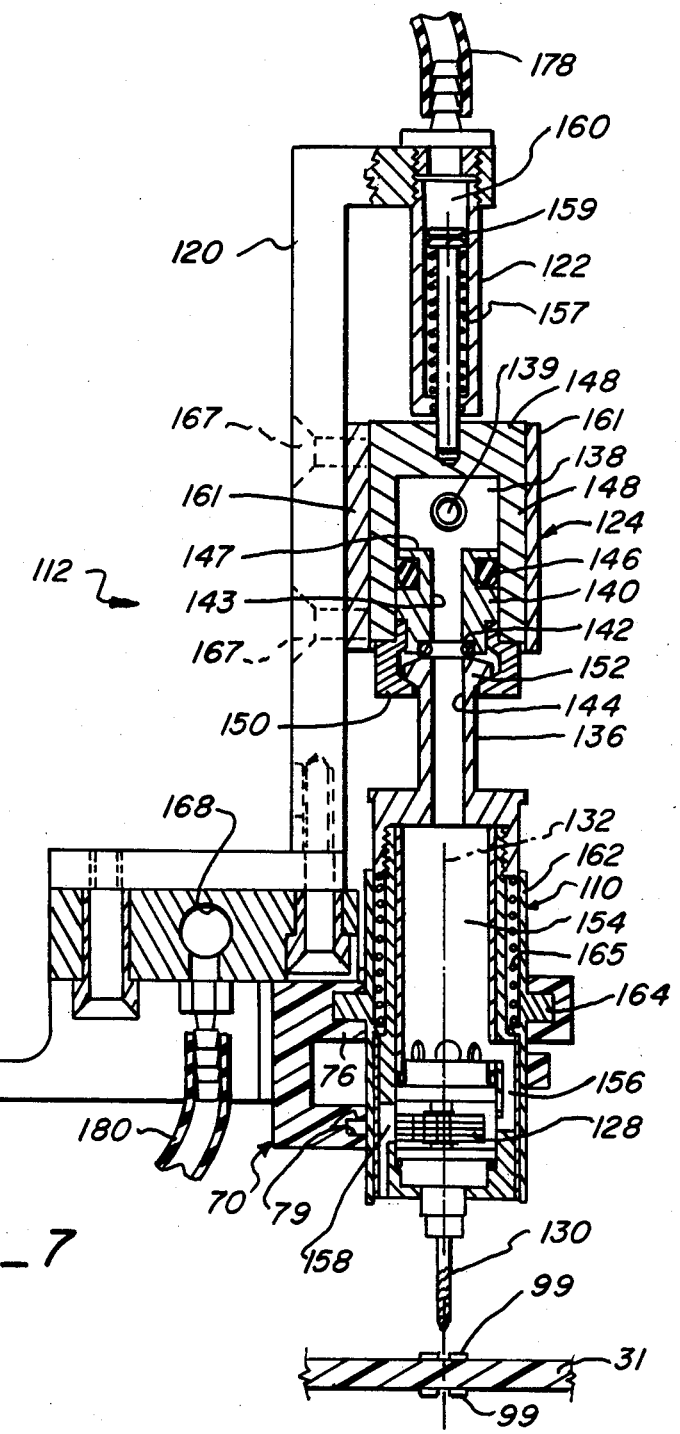
Fig_7

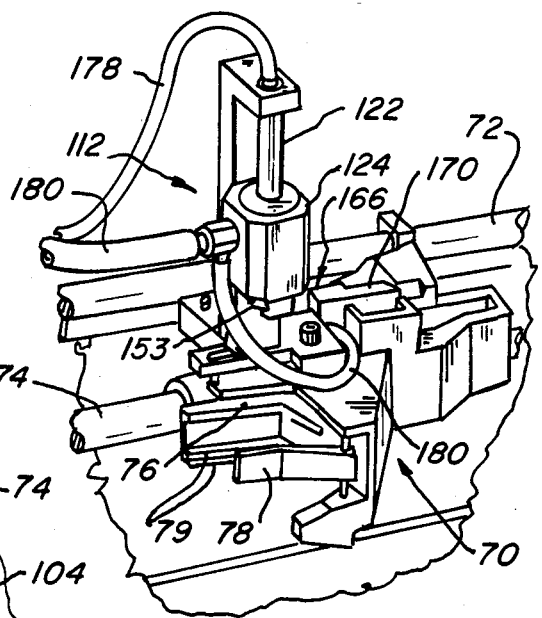
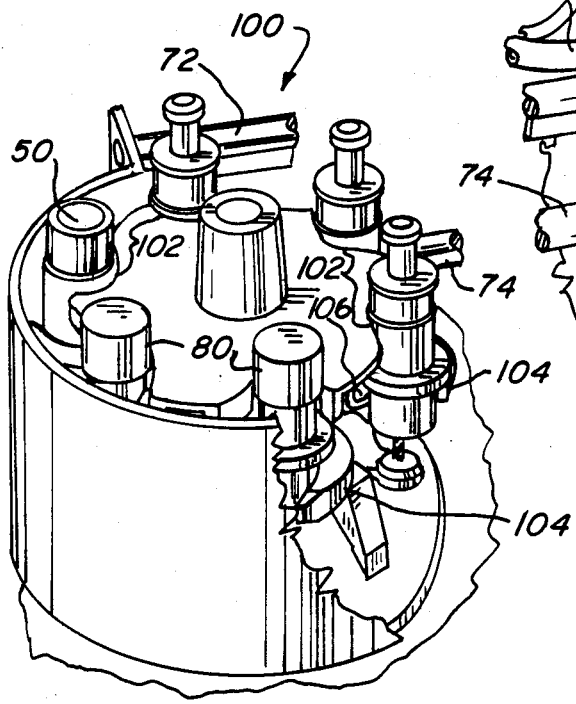
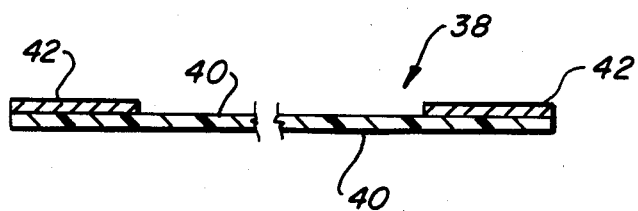
Fig_8
Fig_9
Fig_10

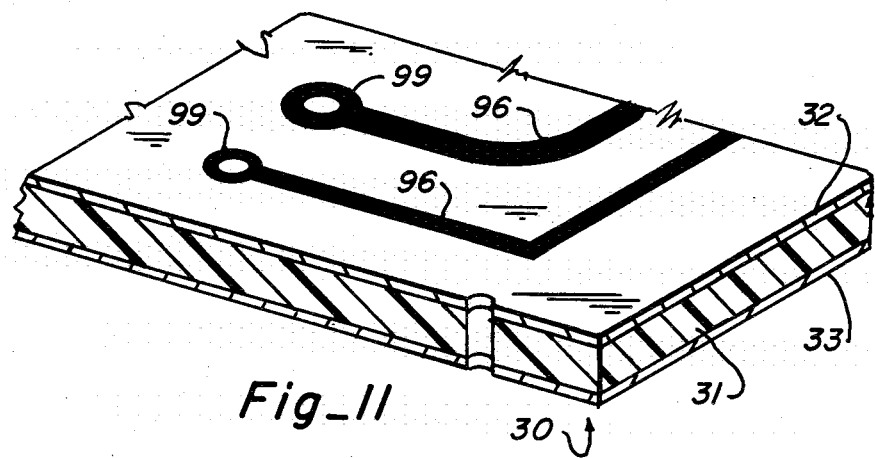
Fig_11
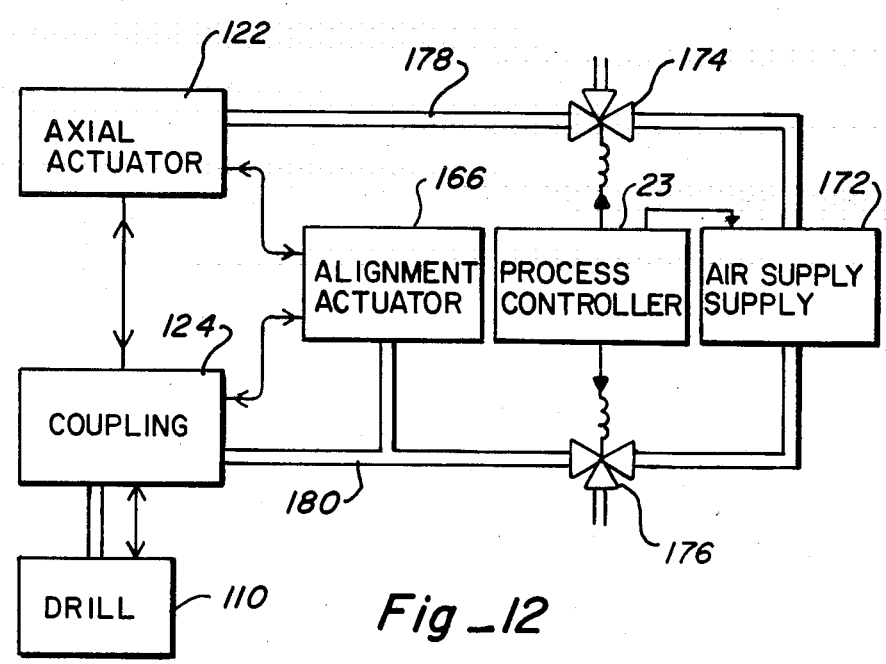
Fig_12

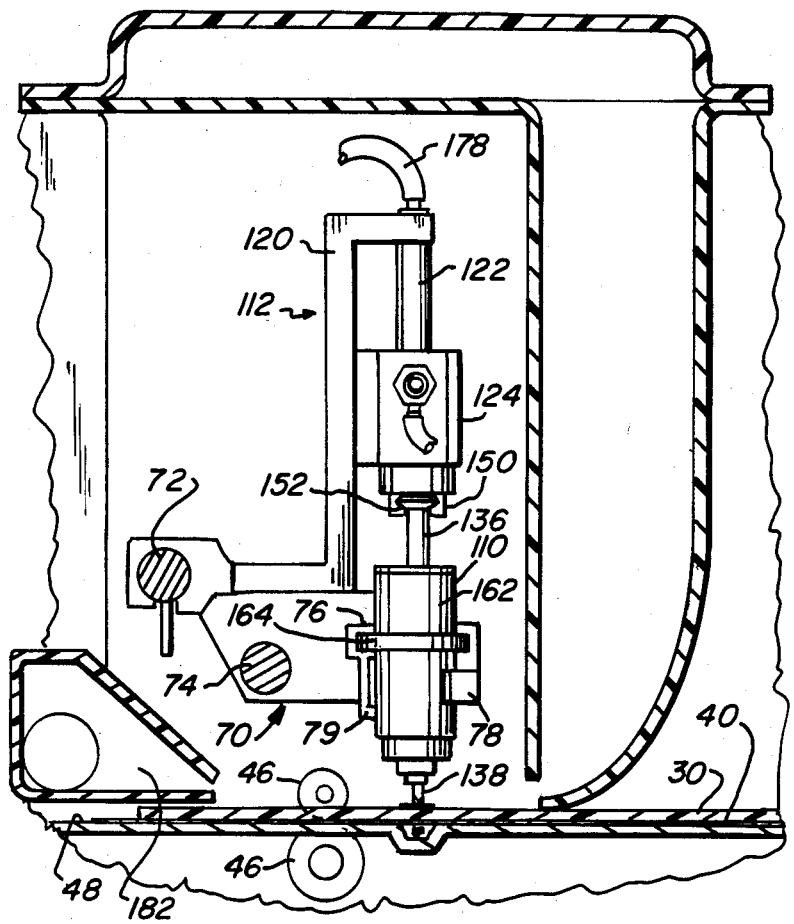
Fig_13
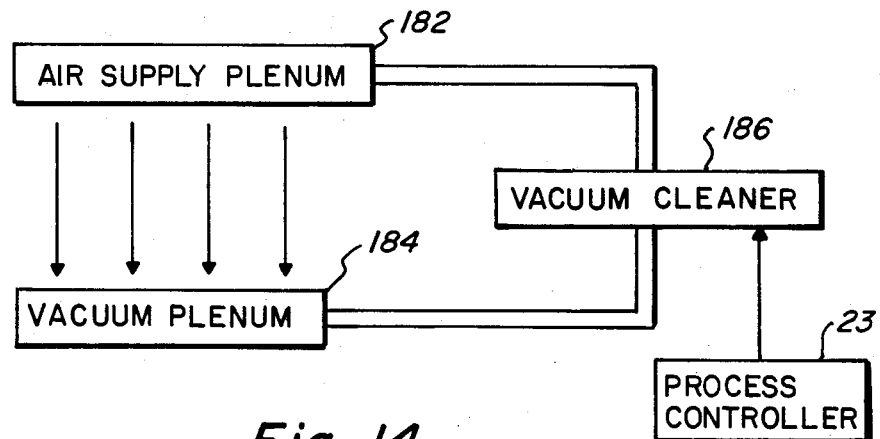
Fig_14

PROCESS FOR USE IN RAPIDLY PRODUCING PRINTED CIRCUIT BOARDS USING A COMPUTER CONTROLLED PLOTTER

The present invention pertains to a process for use in the individualized and rapid production of printed circuit boards, by using a computer controlled plotter and other equipment to lay down etchant-resistant material (resist) on a conductive-sheet clad board or a copper-clad board from which the printed circuit board is produced and to drill holes in the etched printed circuit board, among other things.

This invention is related to an invention for a Drill Apparatus for Use with Computer Controlled Plotter, Serial No. 725,415, now U.S. Pat. No. 4,654,956, and an invention for an Optical Sight for Computer Controlled Plotter with Improved Locating Capability, Serial No. 725,416, now U.S. Pat. No. 4,654,517, both of which are filed concurrently herewith, are assigned to the assignee hereof, and are incorporated herein by reference.

BACKGROUND OF THE INVENTION

A printed circuit board serves as a support chassis for the various electronic integrated circuits, resistors, capacitors, and other discrete components. The printed circuit board also provides the copper or other metallic conductors for conducting the electrical current between the various connecting terminals of the components. Printed circuit boards are usually preferred for the construction of any electronic circuit because they are easy and economical to mass manufacture, problems are easier to detect due to the orderly and observable conductor paths between terminals as compared to the maze of free wires present in other types of circuits, spurious problems occur less frequently because the conductors are fixed to the board, and the circuit is more compact.

The production of a printed circuit board upon which to assemble and test the electronic components of a prototype of a piece of electronic equipment is one of the critical steps in the successful development of the eletronic equipment. While techniques such as bread-boarding and wire-wrapping can be used in the early stages of the prototype testing, it is prudent practice to test final prototypes using a printed circuit board which duplicates the production product. A printed circuit board can create electronic anomalies which are not present in the bread-boarded or wire-wrapped prototype, or the printed circuit board can avoid problems which the bread-boarded or wire-wrapped prototype created. Thus, before mass production, the final production version of the printed circuit board must usually be derived. In practice, a series of prototype printed circuit boards usually evolve before a satisfactory final version is obtained. Adequate prototype testing can usually eliminate the necessity to make modifications in the printed circuit board after mass production of the electronic equipment commences.

In the past, one of the most significant problems in testing electrical prototypes using printed circuit boards was the time and expense required to produce the prototype printed circuit board. The usual process of producing a printed circuit board had to be followed regardless of whether a single prototype printed circuit board was required or whether a large number of mass produced printed circuit boards was required.

The most common process for producing printed circuit boards usually starts with making drawings of the printed circuit conductor pattern. The drawings can be manually prepared at great time and expense, or the drawings can be produced more economically and quickly with a computer containing printed circuit board computer aided design software and with a plotter controlled by the computer. A working copy or photographic positive is photographically produced from the drawings. Alternatively, a computer controlled photoplotter can be employed to directly create the working copy on a photographically treated plate. A copper clad board is next completely coated with photoresist material and allowed to cure. The working copy is placed over the cured photoresist material, and the photoresist material not shielded by the working copy is exposed. The photoresist material is developed and washed away, leaving the remaining photoresist material adhering to the copper surface in the printed circuit conductor pattern. The exposed copper is etched away in an etchant or acid bath to leave only the desired circuit pattern of copper on the plastic substrate of the board. The resist material resists the acid etchant effects and prevents the acid from etching away the thin layer of copper beneath the resist material, thereby leaving the conductors. After etching, the resist material is removed. Holes are drilled in the board at selected locations to receive the wire connection terminals of the electronic components to be soldered or attached to the printed circuit board.

The completion time for these conventional prior production processes may range from approximately one to eight weeks, with the typical average ranging between two and three weeks. Even when the process is accelerated as much as possible, significant time delays are common. One source of delay involves the photographic steps necessary to obtain the working master from the drawing and the photographic preparation of the circuit board prior to etching. Another practical source of delay is the fact that most printed circuit production facilities operate primarily for mass production purposes and have extensive backlogs for production. The typical cost of a commercially-produced single prototype printed circuit board of approximately six inches by eight inches with circuit conductors formed on both sides of the board can range from five hundred to one thousand dollars.

Other less common circuit board production techniques involve plating metal onto the copper or conductor pattern on the circuit board, or a catalytic technique which involves the electroless deposition of conductive conductors on a fiberglass substrate. These circuit board production methods involve intricate or time consuming steps and are also accompanied by various inconveniences.

It is apparent, therefore, that the various disadvantages of conventional circuit board production techniques hamper the individual production of single circuit boards. These disadvantages can seriously hamper the development, testing and prototyping of electronic equipment. The costs of producing printed circuit boards can also be prohibitive, especially when it is necessary to evolve a series of prototype printed circuit boards before the final desired version is achieved.

SUMMARY OF THE INVENTION

The major objective of the present invention is to teach a process for use in rapidly producing printed circuit boards by using a computer controlled plotter. Many of the time-consumptive delays, technical intricacies and expensive costs involved in the prior techniques of producing printed circuit boards can be eliminated or avoided.

By way of generalized summary, the major aspects of the present process for use in producing printed circuit boards involve the use of a conventional plotter controlled by a conventional computer. A conductive sheet clad board, such as a copper-clad board, is operatively retained in the plotter. Resist material is directly applied on a conductive sheet of the board from a marking device manipulated by the plotter. The marking device is preferably a pen containing ink-like resist material. The computer preferably contains printed circuit board computer aided design information recorded in its memory. The computer controls the plotter to manipulate the pen and the board to mark the resist material in the printed circuit pattern directly on the conductive sheet of the board. After the printed circuit pattern of resist material has been marked on each conductive sheet of the board and the board has been etched in the conventional manner to leave the conductor pattern, the board is drilled with the aid of the plotter. A drill motor is manipulated by the plotter in much the same fashion as the pen is manipulated. The drill motor is actuated to drill through the board at predetermined locations to provide holes for receiving the conductor leads of components to be soldered to the board. An operating mechanism is attached to a carrier mechnanism of the plotter for the purposes of operating the drill motor, and to allow the drill motor to be manipulated in a fashion similar to that in which the carrier mechanism manipulates conventional plotter instruments such as pens or optical sights. The computer thereby controls the drilling of the holes in the printed circuit board. To orient the printed circuit board in the plotter, optical sights are used to establish the location of a plurality of locating holes or reference points on the board. Information regarding the location of the locating holes establishes the orientation of the board in the plotter so that the printed circuit board computer aided design software can control the drilling in the predetermined locations and can align the conductor patterns appropriately on both sides of the board. The printed circuit patterns are aligned on opposite sides of the boards so that holes drilled through the board intersect particular conductor portions on opposite sides of the board.

The nature and details of the process of the present invention are more completely understood by reference to the following description of the preferred embodiments taken in conjunction with the drawings, and from the appended claims.

BRIEF DESCRIPTION OF THE DRAWINGS

FIG. 1 is a block diagram of a computer, a computer controlled plotter and associated other equipment, the major components of hardware utilized in practicing the present invention.

FIG. 2 is a flow diagram of the preferred steps utilized in practicing one embodiment of the process of the present invention.

FIG. 3 is an abbreviated flow diagram of a series of steps of another embodiment of the process of the present invention, which may include a series of steps shown in FIG. 2.

FIG. 4 is a perspective view of a typical computer controlled plotter and a copper-clad board upon which steps of the process of the present invention are shown being practiced, with certain portions of the plotter shown broken away and with other items shown in exploded relation for clarity.

FIG. 5 is an axial section view through the axis of an optical sight, the section view also intersecting a portion of a carrier mechanism of the plotter shown holding the sight and a copper clad or printed circuit board shown below the sight.

FIG. 6 is an axial section view through the axis of a pen laying down or marking resist material on a copper clad board shown below the pen, the section view also intersecting a portion of a carrier mechanism of the plotter shown holding the pen.

FIG. 7 is an axial section view through the axis of a drill motor and a drill motor operating mechanism for drilling holes in the etched printed circuit board shown below the drill motor, the section view also intersecting a portion of a carrier mechanism of the plotter shown holding the drill motor and to which the drill motor operating mechanism is attached.

FIG. 8 is an enlarged perspective view of a carousel of the plotter shown in FIG. 4 illustrated as carrying at least one optical sight as shown in FIG. 5, at least one pen as shown in FIG. 6, and at least one drill motor as shown in FIG. 7.

FIG. 9 is an enlarged perspective view of a carrier mechanism of the plotter shown in FIG. 4, illustrated as not retaining any type of plotter instrument.

FIG. 10 is an enlarged side section view of a carrier sheet shown in FIG. 4 with a center section broken out.

FIG. 11 is an enlarged perspective view of a portion of the copper clad board shown in FIG. 4 illustrating the resist material placed thereon in the printed circuit pattern.

FIG. 12 is a schematic view of a pneumatic control system for the drill motor and drill motor operating mechanism shown in FIG. 7.

FIG. 13 is a sectioned partial side view of the plotter shown in FIG. 4 illustrating the use of the drill motor and drill motor operating mechanism shown in FIG. 7 in conjunction with an air supply plenum and vacuum plenum for removing the drill particles from the plotter.

FIG. 14 is a schematic view of a vacuum cleaner for use with the air supply plenum and the vacuum plenum shown in FIG. 13.

DESCRIPTION OF PREFERRED EMBODIMENTS

The process of the present invention is practiced with the aid of a conventional computer 20 which operatively controls a conventional plotter 22 through a conventional process controller 23, as shown in FIG. 1. The process controller 23 is a conventional part of most typical computer controlled plotters, with slight modifications to function as noted herein. The process controller 23 converts data from the computer 20 into control signals for the plotter, and communicates signals arising from positioning of the plotter elements and/or from conventional information input devices such as a keyboard 28 and/or a pointing device 29 back to the computer 20. The process controller also controls certain anciliary equipment particular to the present invention as described herein. An information input and computer control device such as a keyboard 24 is provided to directly control the computer 20 and thus the plotter 22. A display device 26 such as a cathode ray tube displays information contained in the memory of the computer 20. The plotter 22 includes a carrier mechanism (generally shown in FIGS. 4 and 9) which retains and manipulates various instruments during the process of the present invention. Such instruments include an optical sight (FIG. 5), a resist marking pen (FIG. 6) and a drill motor (FIG. 7).

Recorded within the memory of the computer 20 is printed circuit board computer-aided design (PCB CAD) software useful in producing the artwork or printed circuit conductor pattern for a printed circuit board. The PCB CAD software operates from circuit information and electronic component information entered at the keyboard 24 and/or prerecorded as a part of the software. Such PCB CAD software is conventional and presents data in a conventional Gerber photoplotter format. One specific supplier of this type of software is Personal CAD Systems, Inc. of Los Gatos, Calif., USA, 95030, which produces software known as a "P-CAD" System. The computer 20 may advantageously be one of the type known at the present time as a personal computer, such as an IBM personal computer. The plotter 22 is, of course, compatible with the computer 20. One type of plotter 22 which has proved very satisfactory for use in the present invention is a Hewlett-Packard Model 7475A plotter.

Also recorded in the memory of the computer 20 is software the same as or functionally similar to that appearing in a direct printed source code listing in the attached Appendix. This software is designated herein as the CM 3000 software. The function of the CM 3000 software is generally to convert signals in the Gerber photoplotter format from the PCB CAD software for use by the process controller 23 to control the plotter 22, and to convert signals from the process controller into the Gerber photoplotter format and other forms which are recognized by and which will interact with the PCB CAD software, and accomplish other transformations in the specific manner described hereinafter.

The usual function of the PCB CAD software is to produce the ink drawings or inked artwork from which the conventional printed circuit working copy is photographically derived. However, in the practice of the present invention, the previous conventional steps of producing the artwork and photographically deriving the working copy, among others, can be essentially eliminated, thus achieving substantial savings in time required to obtain the printed circuit board and achieving substantial reductions in the cost of producing such printed circuit boards. Particularly, the cost of modifying circuit boards during prototyping is greatly reduced. Instead, PCB CAD and CM 3000 software in the present invention controls the direct application of resist material in the printed circuit pattern directly onto the copper clad board and the drilling of holes into the etched board, among other things.

The process of producing a printed circuit board starts with a copper clad board 30 shown in FIGS. 4 and 11. The copper clad board is of the typical construction having a sheet-like plastic or fiberglass center substrate 31 and sheets 32 and 33 of thin copper or other conductive metal adhered to each opposite parallel large flat side of the substrate 31, as shown in FIG. 11. The process of the present invention can also be practiced using copper clad circuit boards having a copper sheet 32 and 33 on only one side of the center substrate 31. Copper clad boards are readily available from a number of commercial sources. One example of a copper clad board is a one ounce clad FR-4 board available from Oak Materials Group, Inc., Laminates Division, of Franklin, N.H., U.S.A., 03235.

The preferred steps of the process of the present invention are shown in FIG. 2 in abbreviated form and are referenced by alphabetical letters. The process commences by drilling three locating holes in the copper clad board at locations outside of a working area within which the printed circuit pattern will be produced. The holes are drilled to define two perpendicular axes on the circuit board. This step is referenced as step A in FIG. 2. The copper clad board 30 and locations of the three locating holes 34, 35 and 36 are illustrated in FIG. 4. The three locating holes are reference points for establishing the working area of the board 30 and serve as a means for the CM 3000 software to recognize and identify which of the two sides or sheets 32 or 33 of the board 30 is in the upward facing or operative position upon which to receive the application of the activities of the invention. To accomplish step A as shown in FIG. 2, it is contemplated that the three locating holes are manually drilled in the board 30.

The outer surfaces of both copper sheets 32 and 33 of the board are next cleaned and dried, as indicated in FIG. 2 at step B. Cleaning may be accomplished by use of any conventional type of copper surface circuit board cleaner. Cleaning readies the surface of the copper to accept the resist material which will be appllied later. The cleaning also causes the resist material to adhere better to the copper.

The cleaned and dried copper clad circuit board is attached to a carrier sheet, as indicated at step C. The carrier sheet may be a piece of paper or a Mylar sheet type of carrier sheet as is illustrated at 38 in FIGS. 4 and 10. Along each transversely opposite longitudinal edge of a rectangular sheet 40 of clear Mylar there is attached a narrow metal strip 42. The strip 42 provides a substantially rigid edge structure for holding the Mylar sheet flat on a table 48 (FIG. 4) of the plotter. The copper clad board 30 is attached to the carrier sheet 38 by tape 44. Sufficient tape 44 is employed so that the copper clad board 30 remains firmly located at a fixed location on the carrier sheet 38. The first upward facing surface of the upper copper sheet is designated side one.

The carrier sheet 38 with the attached copper clad board 30 is thereafter inserted into the plotter 22, as indicated at step D in FIG. 2 and as is shown in FIG. 4. The board 30 is thus retained for operative manipulation in the plotter. Each edge strip 42 of the carrier sheet 38 aligns with pinch rollers 46 of the plotter 22. The pinch rollers 46 firmly grip each transversely opposite edge strip 42 and the carrier sheet portion below the strip 42. Rotation of the rollers 46 moves the carrier sheet 38 longitudinally along a table 48 of the plotter 22. By the rotation of the pinch rollers 46, longitudinal positioning of the board 30 is achieved. When paper is used as the carrier sheet, the pinch rollers 46 pinch the paper between gritty roughened surfaces of the rollers 46 to create small indentions in the paper. The indentions create a tooth-like effect in the paper and prevent relative movement between the paper and the pinch rollers 46. The metal edge strip 42 on the carrier sheet 38 achieves approximately the same function, although the metal edge strip is much stronger and allows the sheet carrier 38 to be repeatedly used to make numerous printed circuit boards.

The position or orientation of the copper clad board 30 and the working area of the copper clad board are next established by locating the three locating holes or reference points in the board, as indicated at step E in FIG. 2. The three locating holes are located by the use of an optical sight 50 shown in FIG. 5. Signals supplied by the process controller 23 (FIG. 1) corresponding to the locations of the three locating holes are acted upon by the CM 3000 software to establish the position and orientation of the board and the size of the working area.

The optical sight 50 includes an exterior housing 52 having an annular positioning shoulder 54 formed thereon at a middle location between its upper and lower ends. An image conduit 56 extends downward from the housing 52. The image conduit 56 is defined by a plurality of parallel aligned optical fibers formed in a rigid integral cylindrical configuration. The optical fibers extend parallel to an optical axis 58 about which the optical sight 50 is concentric. An optical alignment spot 60 is located on the axis 58 at a bottom surface 62 of the image conduit 56. Reticular or graticular patterns other than the spot 60 can be used. A bi-convex magnifying lens 64 is centered on the axis 58 above a top surface 66 of the image conduit 56 and within an open hollow interior space 68 of the housing 52.

Light passes down the image conduit to illuminate the area below the image conduit. Light is reflected from an object back into the image conduit 56 at the bottom surface 62 and travels up the image conduit through the optical fibers in parallel alignment with the axis 58. The image represented by the light exiting from the top surface 66 of the image conduit 56 is magnified by the lens 64. An observer looking downward along the axis 58 through the lens 64 therefore sees a magnified image of that which is located along the axis 58 below the bottom surface 62 of the image conduit 56.

In use, the optical sight 50 is carried by a carrier mechanism 70, as shown in FIGS. 4, 5 and 9. The carrier mechanism 70 is a conventional part of the plotter 22. The carrier mechanism moves transversely on rods 72 and 74 from side to side along the plotter table 48. As shown in FIGS. 5 and 9, the carrier mechanism 70 includes a receiving groove 76 which receives the annular shoulder 54 of the sight 50 or the other instruments carried, and a spring biased lever 78 for retaining the instrument received with its operative axis in a predetermined fixed location with respect to the carrier mechanism 70. A lower support ridge 79 also contacts the exterior surface of the housing 52 to help hold the sight 50 or other instrument in place in the carrier mechanism 70.

To optically locate the three locating holes (step E in FIG. 2), the optical sight 50 is positioned in and retained by the carrier mechanism 70. The carrier mechanism 70 is controlled by the keyboard 28 or computer 20 (FIG. 1) to move it transversely from side to side along the rods 72 and 74, and the pinch rollers 46 are controlled to move the carrier sheet 38 longitudinally, as can be understood from FIG. 4. The board 30 and carrier mechanism 70 are manually moved in this manner until, by sighting down the axis 58 in the optical sight 50, the spot 60 is located in the center of one of the three locating holes, e.g. 34, as shown in FIG. 5. Once this position is achieved, signals are sent by the process controller 23 to the computer 20 (FIG. 1). These signals are transformed by the CM 3000 software into a format which defines the predetermined location of each particular locating hole. The locating hole information is thereafter used by the CM 3000 software to define and proportion the working area which will receive the printed circuit pattern. This information is supplied as coordinates in Gerber photoplotter format so the PCB CAD software can apply the conductor pattern in the working area. Resolutions of thousandths of an inch are possible with many commercially available plotters.

Optical sights for use with computer controlled plotters are conventional. However, sufficiently accurate alignment with the holes in the board is very difficult or impossible with conventional sights, for purposes of the present invention. Because of the magnification capability achieved by the lens 64 in the sight 50, a high degree of accuracy, with variances in the neighborhood of 0.0015 inches can be achieved. These variances are about four times less than the variances resulting from use of conventional optical sights. Such accuray is difficult to obtain by use of the conventional non-magnifying optical sights. Improved optical sights having a high degree of resolution for use in the process of the present invention are described in greater detail in the aforementioned invention for an Optical Sight for computer Controlled Plotter with Improved Locating Capability. This copending invention also describes an electronic sight which obtains electronic signals for positioning the carrier mechanism and locating the locating holes substantially automatically.

The three locating holes 34, 35 and 36 are preferably located near the outside edges of the copper clad board 30. By locating the three locating holes near the three corners of the copper clad board, the CM 3000 software is able to establish the orientation, the transverse and longitudinal dimensions of the board, the working area in a rectangle within the three locating holes, and the side of the board which is facing up. The relative location of the three locating holes is a mirror image when the second side of the copper clad board is facing up compared to the first side. The locating hole information first supplied to the CM 3000 software defines the first side. The computer recognizes the different relationship from the locating hole information and thus can distinguish between the two sides of the board. Since two-sided printed circuit boards have different conductor patterns on opposite sides of the board it is very important to be able to distinguish between the sides when the circuit pattern is created.

After the working area on the first side of the copper clad board is established as a result of step E shown in FIG. 2, the printed circuit pattern of resist material is laid down on side one (the first upward facing side) of the copper clad board, as indicated at step F. The resist is applied by a pen 80 carried by the carrier mechanism 70, as shown in FIGS. 4 and 6. The computer controls the plotter and the pen to lay down the resist directly on the copper-conductive sheet of the first side of the copper clad board. The resist is laid down in the printed circuit conductor pattern defined by the PCB CAAD software. The CM 3000 software controls the acceleration, speed and position movements of the carrier mechanism and the carrier sheet so the resist material applied by the pen flows smoothly and predictably.

The pen 80 itself is shown in greater detail in FIG. 6. The pen 80 includes an outer housing 82 having an annular positioning shoulder 84. An interior tube member 86 is threaded into the housing 82. The tube member 86 has a hollow interior 88 which contains a supply of flowable viscous resist material 90 somewhat of the consistency of an ink. The resist material 90 flows by capillary action down a capillary marking tube assembly 92 to a marking point 94. The marking point 94 is of a crenelated configuration (not shown) which allows the ink-like resist material 90 to flow from the point 94 and onto the copper sheet 32 the board 30, also by attractive capillary effects. A line 96 of resist material is deposited and the width of the line is established by the diameter of the capillary tube 92. The tube assembly 92 has the conventional configuration of a technical drafting pen and is held in place connected to the tube member 86 by a bottom plug member 95. A cap 97 is removably attached to the top of the interior tube member 86 so the supply of resist 90 in the interior chamber 88 can be periodically replenished.

The exterior configuration of the portions of the pen 80 which contact the carrier assembly 70 is of the same size and shape as the optical sight 50 (FIG. 5) and the other instruments used in the plotter. The pen 80 is concentric about an operative axis 98 and this axis is located in a fixed position on the carrier mechanism 70 when the shoulder 84 of the pen 80 is received in the groove 76, the ridge support 79 rests against the outer housing 82 and the pen 80 is held in place by the lever 78 of the carrier mechanism. The operative axis through each of the instruments is located in the same position on the carrier mechanism. It is in this manner that the precise locational effects on the board are achieved by each instrument. An ink-like resist material satisfactory for use in the pen is Shipley 119S photoresist supplied by Shipley Company, Inc. of Newton, Mass., U.S.A., 02162, which has been diluted by the addition of 10% (by volume) cellosolve acetate.

The resist is laid down on the copper clad board under the control of the PCB CAD and CM 3000 software of the computer, which controls the plotter. The carrier mechanism 70 moves the pen transversely and the pinch rollers 46 move the carrier sheet 38 longitudinally to create the desired printed circuit pattern of resist on the board 30. These patterns include lines 96 which extend straight in the longitudinal and transverse dimensions and which curve in both longitudinal and transverse dimensions, and connection pad rings 99, all of which are shown in greater detail in FIG. 11.

To achieve different widths of lines 96 of resist, it is advantageous to utilize different pens, each of which has a different width marking point 94 (FIG. 6) but which is otherwise the same in size and configuration. Multiple pens 80 can be carried in a carousel assembly 100 of the plotter 22, as shown in FIG. 8. Each of these different pens 80 has a different width marking point. Each pen is received in the carrier mechanism with its operative axis in the same location on the carrier mechanism. The different pens are automatically transferred one at a time from the carousel assembly 100 to the carrier assembly under the control of the computer. Different width lines of resist can thus be laid down at different locations on the board.

It is conventional to automatically transfer different pens to the carrier mechanism from the carousel assembly 100 during use of the plotter. In the transfer procedure, one pen is transferred from an instrument-holding location 102 in the carousel assembly 100, as shown in FIG. 8. The carousel assembly 100 is indexed a partial rotational turn to align the selected instrument-holding location 102 and instrument carried therein with the carrier mechanism. Biased holding fingers 104 on the carousel 100 hold the instruments in the holding locations 102. When an instrument transfer takes place, the carrier mechanism moves transversely along the rods 72 and 74 and into contact with the carousel 100. The holding lever 78 (FIG. 9) of the carrier mechanism moves in between the housing of the instrument on the carousel and the holding finger 104, thus forcing the holding finger 104 to release its grip on the instrument and allowing the holding lever 78 to contact and retain the instrument. The carrier mechanism withdraws transversely and removes the instrument from the carousel because the holding lever 78 grips it and the holding finger 104 is held out of contact with the instrument. When the instrument is transferred from the carrier mechanism back to the carousel, the reverse situation occurs. The holding finger 104 pushes the holding lever 78 out of contact with the instrument and the holding finger 104 grips and retains the instrument in the holding location 102 of the carousal as the carrier mechanism withdraws. When the instrument rests in the holding location 102 on the carousel 100, its annular positioning shoulder sits on a support surface 106.

The movement of the carrier mechanism and the rotational position of the carousel is controlled by the computer. Information as to the width of the marking point of each pen located in a different holding location on the carousel is recorded by the CM 3000 software. This information is utilized by the CM 3000 software to select different instruments for use in the production of the printed circuit boards in accordance with the present invention. Another function of the CM 3000 software is to select which pen with a particular marking width is best used to create wide conductor paths. Such wide conductor paths are created by multiple passes by the pen under the control of the software, with each pass offset by a predetermined percentage of the marking width from one another. The CM 3000 software also allows the user to arrange or rearrange the types and locations of instruments in the carousel, when practicing the invention.

Different widths of marked resist will be created for certain conductors which need different current carrying capacities. Wider conductors are capable of carrying more current than narrower conductors. The different width resist lines are laid down automatically on the copper clad board by transferring pens as the circuit pattern is produced, or by making the multiple, generally-parallel, adjacent or overlapping lines of resist with a pen. When marking multiple overlapping lines, it is desirable to minimize the amount of overlap but still obtain good fluid flow. Excessive amounts of overlap increase the chances of clogging the pen. For a given width conductor, the CM 3000 software will select the pen of optimum marking line width to create the desired conductor width by multiple overlapping lines or passes or resist lines, but without excessively overlapping each of the marking lines of resist. Different width lines 96 of resist are illustrated in FIG. 11.

To produce the generally circular conductor connection pad rings 99, as shown in FIG. 11, it is generally desired that these pad rings should each be formed as a circular ring with an open center not covered with resist. The width of the ring can be established by the number of concentric circles of resist laid down. By leaving the center of the pad unmarked, the etchant will etch out the copper sheet at this center location and reduce the amount of force and energy necessary for drilling the hole through the center of the ring to form the connection pad. The etched away copper at the center will not require penetration by the drill bit, and will serve as pilot to center the drill.

After the complete printed circuit board pattern has been marked with resist on the copper clad board, as indicated at step F in FIG. 2, the carrier sheet 38 will be removed from the plotter, as indicated at step G, and the copper clad board 30 with the resist-marked circuit pattern will be removed from the carrier sheet as indicated at step H. The printed circuit resist pattern on the first side of the copper clad board will be allowed to dry as indicated at step I. To accelerate the drying, the resist pattern may be subjected to a mild stream of heated air, such as that from a hair dryer.

After the printed circuit board pattern of resist material has sufficiently dried on the first side of the copper clad board, as indicated at step I, the first side is placed down against the carrier sheet and the second unmarked side of the copper clad board is placed to face upward on the carrier sheet and is attached to the carrier sheet, as indicated at step J. Thereafter, the individual steps referenced at D, E, F, G and H are repeated on the second side of the copper clad board in the same manner as has previously been described as occurring on the first side of the copper clad board. At the completion of the steps D, E, F, G and H on the second side of the copper clad board, the the printed circuit board pattern of resist on both sides of the copper clad board has been laid down. Because both sides of the board have been separately identified by the software with respect to one another due to the alignment of the three locating holes, the computer program has assured that various electrical conductors and rings are positioned accurately on opposite sides of the board to allow drilling through the rings or other conductors from either side of the board to establish the electrical connections between both sides of the circuit board when conductors are inserted and soldered in the drilled holes.

After the resist pattern has been placed on both sides of the copper clad board, the resist is cured, as referenced at step K. The curing process is typical and is dictated by the particular type of resist material used. Normally speaking, baking the copper clad board and the marked pattern of resist for a predetermined amount of time in an oven at a preestablished temperature achieves sufficient curing so that the resist will not be substantially eroded or attacked by the acid etchant.

After curing the resist, the printed circuit board is etched, as indicated at step L. Etching is achieved in the conventional manner by immersing the copper clad circuit board with the cured resist pattern in a bath or spray of etchant. The etchant attacks the copper and erodes or dissolves it from the plastic substrate of the board, leaving only the copper in the pattern protected by the cured resist.

After etching, the resist material is cleaned from the copper underneath it by a conventional cleaning process, as indicated at step M. Thereafter, the printed circuit board which has been produced as a result of the etching is rinsed and dried.

One step indicated at C or J and both steps indicated at D and E are thereafter repeated. The particular side of the printed circuit board which is up when it is attached to the carrier sheet is not important, because the CM 3000 software will recognize which side of the printed circuit board is up as a result of locating the three locating holes as indicated at step E, and because the circuit patterns on both sides of the board have been aligned.

Thereafter, the component connection holes are drilled at the predetermined locations at the center of the conductor ring pads, and at other locations if desired, as indicated at step N. The location of the connection holes is established by the PCB CAD and CM 3000 software, by using the same reference information which defined the axis of each conductor ring pad 99 (FIG. 11). At each connection hole location, the resist material has been laid down as a concentric ring as previously explained. The center location of the ring is devoid of copper due to the effect of the etchant. Drilling the holes is thus simplified because of the lack of copper at the center location of the hole. Due to the alignment of the circuit pattern on the opposite side of the circuit board, the conductor ring opposite the ring on the upward facing side also has its centermost location devoid of copper and in orthogonal alignment with the center location of the upper facing ring. Thus, the hole need only be drilled through the less structurally resistant plastic substrate 31 (FIG. 11) of the printed circuit board.

Drilling the connection holes, as indicated at step M, is accomplished by use of the plotter 22, a drill motor 110 and a drill motor operating mechanism 112 as shown in FIGS. 4, 7 and 13, under the control of the computer 20 (FIG. 1). The operating mechanism 112 includes a tower 120, which is attached to the carrier mechanism 70, an actuator means or apparatus such as a cylinder 122 attached to the tower 120, and a pneumatic coupling apparatus 124 attached to the tower 120 and the cylinder 122. The coupling apparatus 124 is adapted to mechanically and pneumatically connect to the drill motor 110 and supply pressurized air to it for operating the drill motor 110. The major portion of the exterior configuration of the drill motor 110 is the same as that of the optical sight 50 and the pen 80. One or more drill motors 110 can therefore be carried by the carousel assembly 100 (FIG. 8) and transferred to and from the carrier mechanism 70 (FIG. 9) in the same manner as other instruments can be transferred.

The application of air pressure to the drill motor 110 rotates a turbine 128 which is connected to a drill bit 130. The drill bit 130 rotates about an operative axis 132. The axis 132 occupies the same position in the carrier mechanism which the axes of the other instruments occupy when they are received by and held in the carrier mechanism. Thus, the positioning of the drill motor 110 is as accurate as with all of the other instruments used by the plotter. The operating mechanism 112 is pneumatically operated to supply pressurized air to rotate the turbine 128 and drill bit 130, and to axially move the coupling apparatus 124 and attached drill motor 110 along the axis 132 to drill the connection holes through the substrate 31 in the center of the pad rings 99, or through other materials. The inside edges of the pad rings 99 are also drilled away to create a smooth cylindrical connection hole.

The coupling apparatus 124 operatively supplies pressurized air to the drill motor 110 to rotate the turbine 128, creates an airtight seal at an upper fitting 136 of the motor 110 through which to supply pressurized air to the turbine, and selectively mechanically grips and releases the upper fitting 136 so the drill motor can be transferred to and from the carrier mechanism in the manner previously described.

The selective mechanical connection and pneumatic seal features of the coupling apparatus 124 are achieved simultaneously as understood from FIG. 7. Upon the application of air pressure to an interior chamber 138 of the coupling apparatus 124 through an inlet 139, an internal slider member 140 moves downward and presses an internal resilient annular sealing ring 142 into contact with the top surface of the upper fitting 136. A passageway 143 extends through the slider member 140 about the axis 132. The sealing ring 142 surrounds the passageway 143 and an axial disposed opening 144 in the fitting 136 through which air pressure is conducted into the motor 110. The slider member 140 moves within the open interior chamber 138, and a large annular sealing ring 146 creates an air pressure seal between the slider member 140 and the interior wall of a housing 148 defining the interior chamber 138. The surface area of an upper force-applying surface 147 of the slider member 140 is considerably greater than the contact surface of the sealing ring 142 with the top of the fitting 136. Since the air pressure within the passageway 143, the opening 144 and the chamber 138 is substantially equal, an airtight seal is assured because the force applied from the surface 147 of the slider member 140 is greater than that force resulting from the ambient air pressure at the exterior of the sealing ring 142. This arrangement assures that the air pressure is transferred between the coupling apparatus 124 and the drill motor 110 without any significant pressure loss.

When the slider member 140 moves downward, creating the seal with the sealing ring 142 on the fitting 136, a mechanical connection to the upper fitting 136 is simultaneously created. Claw-like fingers 150 depend downward from the housing 148 to hold the underside of an annular connection lip 152 of the upper fitting 136 and to align or center the fitting 136 of the drill motor about the axis 132 of the operating mechanism 112. The claw-like fingers 150 define an access opening 153 (FIG. 9) in the side facing the carousel 100 (FIG. 4) which allows the fitting 136 to move out of the fingers 150 when the drill motor 110 is transferred to and from the carrier mechanism. The annular sealing ring 146 rolls slightly up along the interior wall of the housing 148 to slightly lift the slider member 140 and release the mechanical connection to the fitting 136.

A supply of pressurized air for operating the drill motor 100 is conducted through the opening 144 in the fitting 136 into a center chamber 154 of the drill motor 110. A duct 156 conducts the pressurized air from the chamber 154 onto the blades of the turbine 128. An exit duct 158 exhausts the air from the turbine 128 downward in a path generally parallel and adjacent to the drill bit 130. The exhausted air from the turbine 128 serves the useful purpose of dislodging drill particles created during drilling with the drill bit 130. Once the drill particles have been dislodged, they are more readily removed from the plotter as will be described subsequently.

Axial movement of the drill bit 130 along the axis 132 is achieved by pressurizing the actuator air cylinder 122, under control of the computer 20 (FIG. 1). The air cylinder 122 is of conventional construction and operation. A ram 159 moves downward when the chamber 160 above it is pressurized. The ram 159 is free to move upward when the air pressure is released from chamber 160. A return spring 157 lifts the ram 159 upward when the pressure is released from chamber 160. The lower end of the ram 159 is connected to the housing 148 of the coupling apparatus 124. The housing 148 is slideably retained within an outer guide 161 of the coupling apparatus. The guide 161 is rigidly attached to the tower 120 by fasteners 167. The upper end of the air cylinder 122 is also rigidly attached to the tower 120.

Upon axial movement of the ram 159, the housing 148 is pushed downward within the guide 161. The air pressure within the interior chamber 138 continually forces the slider member 140 downward and holds the upper annular lip structure 152 of the fitting 136 in rigid mechanical engagement with the finger 150. Portions of the drill motor 110 are forced downward in unison with the housing 148 of the coupling apparatus 124 when the housing 148 is moved downward by the air cylinder 122.

An outer jacket 162 of the drill motor 110 includes an annular positioning shoulder 164. The annular shoulder 164 is received within the grooves 76 of the carrier assembly 70. The supporting ridge 79 of the carrier mechanism also rests against the lower outside surface of the jacket 162. The elements of the drill motor 110 interior of the jacket 162 are free to slide axially with respect to the jacket 162. A spring 165 biases the interior elements of the drill motor axially upward with respect to the jacket 162. The jacket 162 is thus firmly retained at a stationary location to the carrier mechanism 70, while the interior elements of the drill motor are free to move axially in unison with the housing 148 of the coupling apparatus 124 and the ram 159 of the air cylinder 122. The springs 165 and 157 lift up or return the moveable elements of the drill motor 110, the coupling apparatus 124 and the air cylinder 122 after the air cylinder 122 has forced them downward. The drill bit 130 moves axially downward rotating about the axis 132. The coaxial locations of the fitting 136 and the air cylinder 122 with respect to the drill bit axis 132 prevent tipping or nonlinear movements of the drill bit 130 as the drill bit moves downward.

In order to align the axis 132 of the drill motor 110 and operating mechanism 112 orthogonal to the printed circuit board, an orthogonal alignment apparatus 166 is also provided, as shown in FIG. 9. The typical operation of the carrier mechanism to vertically move the marking point of a conventional pen into and out of contact with a paper is a slight pivoting arc-like movement in a plane perpendicular to the rod 74 (FIG. 4). However, in order to avoid elongating the holes from a round shape, and to avoid placing unnecessary sideloading on the drill bit, this arc-like movement cannot be utilized to advance the drill bit into the material to be drilled. The alignment apparatus 166 includes an air cylinder 168 (FIG. 7) connected to a wedge-shaped element 170. The wedge-shaped element 170, when moved forward by the attached air cylinder 168, forces the pivoted part of the carrier mechanism 70 forward in a plane perpendicular to the rod 74 and aligns the axis 132 orthogonal to the printed circuit board. The thickness of the wedge element 170 creates the desired degree of pivoting of the pivotable portion of the carrier assembly to attain the orthogonal orientation of the axis 132. The tower 120 positions the axis 132 orthogonal to the printed circuit board and the plotter table in a plane parallel to the rod 74. Once the operating mechanism is positioned with its axis 132 orthogonal to the circuit board, the actuator air cylinder 122 can be actuated to axially move the moveable elements of the coupling apparatus 124 and the drill motor 110 to drill the holes.

The pneumatic operating system for the drill motor 110, the actuator air cylinder 122, the coupling apparatus 124, and the alignment apparatus 166 is illustrated in FIG. 12. A supply 172 of air pressure is provided. An electrically controllable valve 174 selectively couples pressurized air from the supply 172 to the actuator air cylinder 122. Another electrically controllable valve 176 selectively supplies air pressure from the supply 172 to the alignment apparatus 166 and the coupling apparatus 124. The valves 174 and 176 are controlled by signals from the process controller 23, as is the energization of the air supply. The CM 3000 software operatively controls the process controller 23 to coordinate the drilling functions with the positioning functions and the drill size selections. Of course, the air pressure supplied to the coupling apparatus 124 is also supplied to the drill motor 110 once the mechanical connection and pneumatic seal is created by the coupling apparatus 124. As shown in FIG. 12, mechanical connections and effects are illustrated by dashed lines with points thereon, electrical effects are illustrated by solid lines with solid arrowheads, and pneumatic supplies are represented by conduits. The sequence of valve operation is that the valve 176 is first actuated, and thereafter the valve 174 is actuated. In this sequence, the operation mechanism 112 is aligned with the axis 132 (FIG. 7) orthogonal to the circuit board and the drill bit 130 commences rotating, and thereafter the drill bit is axially moved by the actuator cylinder 122. Only a single air pressure supply 172 is required and only two flexible hoses 178 and 180 need extend to the operating mechanism 112. A minimum of pneumatic hoses avoids restricting the movement of the carrier mechanism 70.

In order to release the mechanical connection of the drill motor 110 and the coupling apparatus 124 as is understood from FIG. 7, the pressure of the air in the interior chamber 138 of the coupling apparatus 124 is released to ambient pressure. The upper sealing ring 146 rolls slightly upward along the interior wall of the housing 148. This rolling movement lifts the slider member 140 to create a space between the lip of the upper fitting 136 and the fingers 150. With this space and the released contact pressure of the sealing ring 142 with the fitting 136, the drill motor 110 may be transferred freely to and from the carousel assembly 100 (FIG. 8) and to and from the carrier mechanism 70 (FIG. 9).

The ability to transfer different drill motors to and from the carrier mechanism is an important advantage, because it allows different sized holes to be drilled in the printed circuit board. The computer can automatically select the drill motor having the desired diameter of drill bit to drill the desired diameter of hole in a predetermined location in the circuit board.

The coupling apparatus 124 and the alignment apparatus 166 do not interfere with the normal operation of the plotter when a pen is in use. The pen will not contact the coupling apparatus 124 and the carrier mechanism is therefore free to transfer different pens back and forth between the carousel without restriction. However, to use the optical sight 50 (FIG. 5), the tower 120 is pivoted slightly out of alignment with the axis of the sight. The pivoting movement is achieved by manually loosening appropriate fasteners and pivoting the tower assembly out of alignment with the optical axis 58. The user can thereafter sight along the optical axis through the optical sight without interference from the coupling apparatus 124 and air cylinder 122.

Details of the drill motor 110 and the operating mechanism 112 are more completely described in the aforementioned invention for a Drill Apparatus for Use with Computer Controlled Plotter.

A substantial amount of drill particles are created when the holes are drilled in the printed circuit board. These drill particles could have a detrimental effect on the operation of the plotter if they were allowed to accumulate in the plotter. To remove the drill particles during drilling, an air flow supply plenum 182 is attached behind the carrier mechanism and a vacuum plenum 184 is attached in front of the carrier mechanism, as shown in FIGS. 4 and 13. The air supply plenum 182 directs a laminar flow of air across the upper surface of the printed circuit board. The vacuum draws the air carrying the drill particles to the vacuum plenum 184 and carries them away from the plotter to a conventional vacuum cleaner 186, as shown in FIG. 14. The source of the air flow to the air supply plenum 182 is also from the conventional vacuum cleaner 186. The vacuum cleaner is energized by the process controller 23, under the control of the CM 3000 software. The air flow across the top of the printed circuit board during the drilling operation removes substantially all of the drill particles and prevents them from entering the plotter. To further aid in preventing drill particles from entering the plotter, the plotter cabinet below the plotter table can be pressurized to keep the drill particles out of the plotter mechanism and force them into the vacuum air stream. The downward directed exhaust air from the exhaust port 158 (FIG. 7) of the drill motor aids in dislodging these particles as they are drilled away so these particles more readily enter the flow stream between the plenums 182 and 184.

The process of the present invention can be alternatively practiced as shown in FIG. 3. In this alternative embodiment, the process commences by accomplishing steps B and C in order as previously referenced in FIG. 2. Next, the corners of the rectangular copper clad board are roughly located by use of the optical sight, as indicated at step O in FIG. 3. Locating the corners proceeds in a manner somewhat similar to that previously indicated at step E in FIG. 2, except that the corners are located and not the locating holes. The CM 3000 software of the computer is programmed to recognize the corners of the rectangular board in this mode of operation. By recognizing the corners, the rectangular working area inside of the corners is established by the CM 3000 software to account for the proper orientation, proportionality and size of the conductor pattern. That working area will generally be at least one-tenth to one-half of an inch less than the rectangular outer dimensions established by the locations of three corners of the circuit board.

Once the orientation of the circuit board is determined by the rough locations of the corners and the working area is established, the computer operates the plotter to select a drill motor from the carousel and to drill the three locating holes at predetermined locations in the board defining the two perpendicular axes, as indicated at Step P. The location of the locating reference holes may be inside or outside of the working area. Once the three reference locating holes have been drilled, as indicated at Step P, the remaining steps of the process described in FIG. 2 are accomplished, commencing with the step referenced at step F and continuing through all of the steps and terminating at step N. Employing the CM 3000 software to locate and drill the three locating holes assures that the three holes define the two axes in a more precise perpendicular fashion.

Printed circuit boards can be produced according to the present invention considerably faster than by following the conventional methods now used for producing printed circuit boards. The use of the plotter to directly mark and lay down the resist pattern on the copper clad board avoids the presently used and time consumptive methods of photographically producing the resist pattern on the copper clad board. The use of the computer controlled plotter to drill the holes in the circuit board is a substantial advantage since it can be accomplished quickly. The software accurately and quickly indexes the drilling locations in accordance with the software information. In previously used techniques, the hole drilling process is simply a different process from that process which resulted in the creation of the printed circuit pattern. The process of the present invention can be economically practiced by the use of a relatively inexpensive computer and plotter hardware. The arrangement of the operating mechanism on the carrier mechanism of the plotter allows the pens, optical sights and drill motors to be readily interchanged without time delay and under the full automatic control of the computer. All of the hardware necessary to practice the present invention can be incorporated into a relatively small enclosure to allow the user to use the hardware and process of the present invention at his or her desk and without substantial delay in the overall design process of electronic equipment. Other advantages will be apparent after comprehension of the present invention.

The foregoing description describes the preferred steps of two embodiments of the process of the present invention with a degree of specificity. It should be understood, however, that the description has been made by way of preferred example and that the invention is defined by the scope of the appended claims.

```
PAGE 1  February 21, 1985  06:10 PM    CM3000.C

/***************************************************************
PROGRAM ca3000 -- CAD Magic/3000 master control program.

**/
#include "stdio.h"
#include "cm3000.h"
#include "menu1.h"

/***************************************************************
EXTERNALS
***************************************************************/
extern int _stack;        /* see stack module for stack size */
extern MENU1 t1menu1;     /* top level menu structure */
/***************************************************************
GLOBALS
***************************************************************/

/* configuration file */
char cfgfile[] = "cm3000.cfg";

/* plot file variables */
char plotfile[NAMELGTH+1];   /* active plot file name */
FILE *plotfp;                /* active plot file file pointer */
char compfile[NAMELGTH+1];
FILE *compfp;
char soldfile[NAMELGTH+1];
FILE *soldfp;

/* cad magic hardware port */
int port;                 /* port number (0-3) */
unsigned timeout;         /* timeout value */

/* aperture variables */
long aperptr[NUMAPER+1];  /* ptrs to apertures (ftell/fseek) */
                          /* only apertures 1-12 used */

/* coord system currently in use */
int coordsys;             /* left or right handed coordinates */

/* plot file reference points & digitized reference points */
```

```
double plotref[NUMPTS][NUMCORDS];
double digiref[NUMPTS][NUMCORDS];

/* arrays for x & y coordinates for pads */
unsigned padx[MAXPADS], pady[MAXPADS];

/* papersize */
int papsize;

/* plotter scaling - for Plotter Units to mils */
double xscale;
double yscale;

/* formation constants */
double _a,_b,_c,_d,_e,_f;

/* speed parameters */
   double mspd, pspd, tspd;   /* move, pad, trace speeds */

/* drill up and down speeds */
   unsigned downtime;         /* drill down time */
   unsigned uptime;           /* drill up time */
main()
{
  static char tlmpath[] = "\0";
  int clearscr();      /* clears the user screen */
  int dispban();       /* displays ProtoCAD banner */
  int menu1a();        /* menu driven options */

/* Do those first time things: clear screen, display warning */
  initcfg();
  clearscr();
/************************************************************
  dispban();         /* that irritating message has got to go! */
************************************************************/
  /* enter top level menu */
  menu1a(&tlmpath, &tlmenu1);

/* lets clean up the screen (how I hate a mess) */
  clearscr();

}/* main */

/************************************************************
MODULE
   alldat -- this module contains ALL of the MENU1 data structures
             used by the CAD MAGIC/3000 program.
************************************************************/ include "stdio.h"
include "menu1.h"

/************************************************************
TOP LEVEL MENU (TLM)
************************************************************/
extern int initfile();
extern int drillind();
```

```c
extern int resist();
extern int drill();
extern int config();
extern int sys();

static char tlmid[IDSIZE] = "TLM";                    /* id */
static char *tlmhead[HEADSIZE] = {                    /* header */
  "CAD MAGIC/3000 Top Level Menu (TLM)",
  "=== ========= === ===== ==== =====",
  0
};
static char *tlmbody[BODYSIZE] = {                    /* body */
  "Select file to CAD MAGICIZE.",
  "Drill index holes.",
  "Resist.",
  "Drill.",
  "Configure.",
  "MS-DOS command.",
  0
};
static int (*tlmfunc[FUNCSIZE])() = {                 /* functions */
  initfile,
  drillind,
  resist,
  drill,
  config,
  sys,
};
/************************************************************************
TLM Structure definition -- What the world REALLY sees!
************************************************************************/
MENU1 tlmenu1 = {
  CLEAR,
  &tlmid,
  &tlmhead,
  &tlmbody,
  &tlmfunc
};
/* configuration menu */
extern int editcfg();
extern int initpads();
extern int dumppads();
extern int initvars();
extern int dumpvars();

static char cmid[IDSIZE] = "CM";                      /* id */
static char *cmhead[HEADSIZE] = {                     /* header */
  "Configuration Menu (CM)",
  "============ ==== ====",
  0
};
static char *cmbody[BODYSIZE] = {                     /* body */
  "Edit user config",
  "Set pad descriptions.",
  "Display pad descriptors.",
  "Display variables.",
  0
```

```
};
static int (*cafunc[FUNCSIZE])() = {                    /* functions */
   editcfg,
   initpads,
   dumppads,
   dumpvars,
};
/**********************************************************************
TLM Structure definition -- What the world REALLY sees!
**********************************************************************/
MENU1 camenu1 = {
   CLEAR,
   &cmid,
   &cahead,
   &cabody,
   &cafunc
};
/**********************************************************************
HEADER apr -- APeRture header.

**********************************************************************/
#define _NUMCOL 4
#define _NUMROW 24
#define _SIZE  0
#define _SHAPE 1
#define _TYPE  2
#define _DSIZE 3
/**********************************************************************
shapes
**********************************************************************/
#define UDEF1 0          /* User DEFined */
#define UDEF2 1
#define UDEF3 2
#define UDEF4 3
#define UDEF5 4
define UDEF6 5 define ROUND  6
define SQUARE 7

/**********************************************************************
types
**********************************************************************/
#define LINE  0
#define FLASH 1
/**********************************************************************
HEADER cfg -- header file for configuration init and save routines.

**********************************************************************/
#define var int
#define STR 0
#define INT 1
#define UNS 2
#define DBL 3
```

```
#define CFG struct _cfg
CFG {
  int type;              /* ptr type */
  var *iptr;             /* var ptr - some trickery here */
};
/****************************************************************************
HEADER cm3000.h -- header file for the CAD MAGIC/3000 host resident software.

****************************************************************************/

/****************************************************************************
DATA STRUCTURES
****************************************************************************/

/****************************************************************************
DEFINES FOR PAD GENERATION
****************************************************************************/
#define PADTYPES 24
#define MAXPADS 2000
#define MAXR 10
define MAXTHETA 64 define MINPEN 1
define MAXPEN 6 define PRSIZE 216              /* 24*2 + 24*1 + 24*6 */

/****************************************************************************
DEFINES FOR LINE GENERATION
****************************************************************************/
#define LINETYPES 24

/****************************************************************************
DEFINES FOR GLOBAL VARIABLES
****************************************************************************/
/* plot file defines */
#define MAXFILES 10
#define NAMELGTH 80

/* layer defines */
#define NUMAPER 24

/* reference layer */
#define REF1 22
#define REF2 23
#define REF3 24

/* reference points */
#define NUMPTS 4
#define PT1 0
#define PT2 1
#define PT3 2
#define PT4 3
#define NUMCORDS 2
#define X 0
#define Y 1

/* coordinate system type */
```

```
#define RIGHT 1
#define LEFT -1

/* paper size */
#define ASIZE 0
#define BSIZE 1

/* various buffer sizes */
#define INSTSIZE 40
#define BLCKSIZE 80
#define PARMSIZE 10
#define BUFFSIZE 512
#define RESPSIZE 40

/* miscellaneous */
#define MAXINST INSTSIZE
#define CHOILGTH 80
/*****************************************************************
HEADER line.h -- header for line geometry descriptions.

NOTE it is advised that the user always check the vertflag since:

(1) y = m(x - x0) + y0    for vertflag = 0 (false)

(2) m = undefined.        for vertflag = 1 (true)
           x = x0.
           y = undefined.

*****************************************************************/
#define LINE struct _line
define bool int LINE {
  bool vertflag;          /* if 1 (true) is vertical line */
  double m;               /* slope */
  double x0;              /* x coord for pt in pt slope form */
  double y0;              /* y coord for pt in pt slope form */
};
/*****************************************************************
HEADER menu1 -- menu1 type menu structure definition.
*****************************************************************/
#define PATHSIZE 80      /* total path size */
define OPTSIZE  20      /* option buffer size */ define IDSIZE 10        /* path ID SIZE */
define LINESIZE 80
#define HEADSIZE 80
#define BODYSIZE 80
define FUNCSIZE 80 define CLEAR -1
define NOCLEAR 0
```

```
#define MENU1 struct _menu1
MENU1 {
  int clr;
  char (*pathid)[IDSIZE];
  char *(*head)[HEADSIZE];
  char *(*body)[BODYSIZE];
  int  (*(*func)[FUNCSIZE])();
};

/***************************************************************
HEADER pad.h -- PAD structure definition.

***************************************************************/
#define PAD struct _pad
PAD {
  int apernum;          /* aperture number (1-24) */
  int pennum;           /* carousel pen number to be used */
  int dpen;             /* pen diameter */
  int din;              /* inner dimension (dia for circle) */
  int dout;             /* outer dimension (dia for circle) */
  int ppr;              /* points per radii (resolution) */
  int theta0;           /* rotation of polygon */
};
/***************************************************************
DRIVER DATA STRUCTURES
***************************************************************/ define BSTATUS struct _bstat

/* mode bits: #bits/char, bit rate, stop bits */
  unsigned timeout;  /* timeout value for putc, getc, close in mS */
  unsigned imask;    /* input buffer maskbuffsize -1: buffsize = 2**N */
  int iempty;        /* <>0 if empty else not empty */
  unsigned iinp;     /* index into input buff to next avail:  buff */
                     /*   range: 0 <= inp <= mask */
  unsigned ioutp;    /* index into output buff to next avail:  buff */
                     /*   range: 0 <= outp <= mask */
  char *ibuff;       /* ptr to buffer */
  unsigned omask;    /* input buffer maskbuffsize -1: buffsize = 2**N */
  int oempty;        /* <>0 if empty else not empty */
  unsigned oinp;     /* index into input buff to next avail:  buff */
                     /*   range: 0 <= inp <= mask */
  unsigned ooutp;    /* index into output buff to next avail:  buff */
                     /*   range: 0 <= outp <= mask */
  char *obuff;       /* ptr to buffer */
};
/***************************************************************
HEADER text.h -- TEXT structure definition.

***************************************************************/
#define TEXT struct _text
TEXT {
  int apernum;          /* aperture number (1-24) */
  int pennum;           /* carousel pen number to be used */
  int dpen;             /* pen diameter */
};
```

```
/****************************************************************
HEADER trace.h -- TRACE structure definition.

****************************************************************/
#define TRACE struct _trace
TRACE {
    int apernum;            /* aperture number (1-24) */
    int pennum;             /* carousel pen number to be used */
    int dpen;               /* pen diameter */
};
/****************************************************************
FUNCTION adjdigi -- adjust the digitized points to scale 1 to 1 with
               plotter reference points.

returns 1 (TRUE)  if successful.
    returns 0 (FALSE) if not successful (board dimensions too small).

****************************************************************/
#include "stdio.h"
#include "line.h"
#include "cm3000.h"
#define bool int
#define TRUE 1
#define FALSE 0

/****************************************************************
externals
****************************************************************/
extern double xscale;   /* Plotter Units / mil  in X direction */
extern double yscale;   /* Plotter Units / mil  in Y direction */

/****************************************************************
adjdigi
****************************************************************/
bool adjdigi(pref, inref, outref)
double pref[][NUMCORDS];
double inref[][NUMCORDS];
double outref[][NUMCORDS];      /* output: meaningful only if adjdigi=TRUE */
{
    double sqrt();
    double ddist2();
    double pwidth, pheight;     /* plotter board width and height */
    double bwidth, bheight;     /* physical board width and height */
    LINE l23;                   /* line through pts 2 & 3 */
    LINE lpara23;               /* line parallel to pt 2 & 3 */
    LINE l4perp23;              /* line perp through pt 4 and line 23 */
/****************************************************************
adjdigi code begins here
****************************************************************/
    /* check if physical dimensions acceptable */
    pwidth = sqrt( ddist2(pref[PT2][X], pref[PT2][Y], pref[PT3][X], pref[PT3][Y])
);
```

```
  pheight = sqrt( ddist2(pref[PT2][X], pref[PT2][Y], pref[PT1][X], pref[PT1][Y])
);
  bwidth  = sqrt( ddist2(inref[PT2][X], inref[PT2][Y], inref[PT3][X], inref[PT3]
[Y]) ) / xscale;
  bheight = sqrt( ddist2(inref[PT2][X], inref[PT2][Y], inref[PT1][X], inref[PT1]
[Y]) ) / yscale;

if(pwidth > bwidth) {
    printf("\nERROR: adjdigi: copper not wide enough; width: %lf", pwidth);
    printf("\n                         board requires; width: %lf", bwidth);
    printf("\n");
    printf("\n\n");
    printf("\nPress enter key to continue: ");
    getchar();
    return(FALSE);
  }
  if(pheight > bheight) {
    printf("\nERROR: adjdigi: copper height to small; height: %lf", pheight);
    printf("\n                         board requires; height: %lf", bheight);
    printf("\n");
    printf("\n");
    printf("\n\n");
    printf("\nPress enter key to continue: ");
    getchar();
    return(FALSE);
  }

/***************************************************************************
now for the good stuff
***************************************************************************/
  /* PT2 ... (EASY) */
  outref[PT2][X] = inref[PT2][X]; outref[PT2][Y] = inref[PT2][Y];

ptslp( inref[PT2][X], inref[PT2][Y], inref[PT3][X], inref[PT3][Y], &l23 );
  /* PT3 ... (NOT TOO HARD) */
  ptoffline( inref[PT2][X], inref[PT2][Y], inref[PT3][X], inref[PT3][Y],
           xscale * pwidth, &outref[PT3][X], &outref[PT3][Y]);
  /* PT1 ... (NOT TOO HARD) */
  ptoffline( inref[PT2][X], inref[PT2][Y], inref[PT1][X], inref[PT1][Y],
           yscale * pheight, &outref[PT1][X], &outref[PT1][Y]);

/* PT4 ... (THIS ONE WAS TOUGH) */
  para( outref[PT1][X], outref[PT1][Y], &l23, &lpara23);
  perp( outref[PT3][X], outref[PT3][Y], &l23, &l4perp23);
  intsct(&lpara23, &l4perp23, &outref[PT4][X], &outref[PT4][Y] );

return(TRUE);
}
/***************************************************************************
FUNCTION arrdigi -- arrange digitized points in proper order:
             pt1 - upper left.
             pt2 - lower left.
             pt3 - lower right.
             pt4 - upper right.

***************************************************************************/
```

```
#define void int
#include "cm3000.h"
void arrdigi(coord)
double coord[][NUMCORDS];
{
  double tx;
  double ty;

xcordsrt(coord, NUMPTS);              /* find smallest x's */ if(coord[PT1][Y] < coord[PT2][Y]) {   /* sort smallest x's */
    ty = coord[PT1][Y];
    tx = coord[PT1][X];
    coord[PT1][Y] = coord[PT2][Y];
    coord[PT1][X] = coord[PT2][X];
    coord[PT2][Y] = ty;
    coord[PT2][X] = tx;
  } if(coord[PT4][Y] < coord[PT3][Y]) {   /* sort smallest y's */
    ty = coord[PT4][Y];
    tx = coord[PT4][X];
    coord[PT4][Y] = coord[PT3][Y];
    coord[PT4][X] = coord[PT3][X];
    coord[PT3][Y] = ty;
    coord[PT3][X] = tx;
  }
}
/*****************************************************************
FUNCTION
    autodigi -- digitize and calculate xformation constants.

*****************************************************************/
#include "stdio.h"
#include "cm3000.h"

/*****************************************************************
EXTERNALS
*****************************************************************/

/* cad magic hardware */
extern int port;                        /* plotter port */

/* digitized and plotter reference points */
extern double digiref[NUMPTS][NUMCORDS];   /* output parameter */
extern double plotref[NUMPTS][NUMCORDS];   /* input parameter */

/* xformation constants */
extern double _a,_b,_c,_d,_e,_f;        /* output parameters */

/* coordinate system being used (right or left) */
extern int coordsys;                    /* output parameter */ int autodigi()  /* digitizes board and calcs related items: */
            /*    - xformation constants.                */
            /*    - left or right handed coord system.   */
{
  double temp1ref[NUMPTS][NUMCORDS];
  double temp2ref[NUMPTS][NUMCORDS];

int clearscr();       /* clears user screen */
```

```
int digitize();        /* digitize a point from the plotter */
int xformcon();        /* find xformation constants */
int pbputs();          /* put a string to the plotter */ double *px, *py;       /* digitized points returned here */
int point;             /* counts points being digitized */ int c;
/* keep trying to digitize until user feels he's close */
for(;;) {
  /* inform user about the digitizing process */
  printf("\n-Digitize reference-holes on board:");

/* Get index points on board */
    for(point = PT1; point <= PT4; point++) {
      printf("\n -Please digitize hole %ld: ", point+1);

/* pass locations of points to be returned for digitizing */
      px = &temp1ref[point][X]; py = &temp1ref[point][Y];
      digitize(px, py, port);

/* lift the pen after digitizing to let user know that digit completed */
      pbputs(port, "PU;", sizeof("PU;"));
    }
/*****************************************************************
find rectangular area for board
*****************************************************************/
    arrdigi(&temp1ref);
    newdigi(&temp1ref, &temp2ref);
    adjdigi(&plotref, &temp2ref, &digiref);

clearscr();
    printf("\n");
    printf("\n -Plot file summary: plotref");
    printf("\n  -P1: (%lf,%lf)", plotref[PT1][X], plotref[PT1][Y]);
    printf("\n  -P2: (%lf,%lf)", plotref[PT2][X], plotref[PT2][Y]);
    printf("\n  -P3: (%lf,%lf)", plotref[PT3][X], plotref[PT3][Y]);
    printf("\n  -P4: (%lf,%lf)", plotref[PT4][X], plotref[PT4][Y]);

printf("\n -Digitize summary: temp1ref");
    printf("\n  -P1: (%lf,%lf)", temp1ref[PT1][X], temp1ref[PT1][Y]);
    printf("\n  -P2: (%lf,%lf)", temp1ref[PT2][X], temp1ref[PT2][Y]);
    printf("\n  -P3: (%lf,%lf)", temp1ref[PT3][X], temp1ref[PT3][Y]);
    printf("\n  -P4: (%lf,%lf)", temp1ref[PT4][X], temp1ref[PT4][Y]);

printf("\n -Digitize summary: temp2ref");
    printf("\n  -P1: (%lf,%lf)", temp2ref[PT1][X], temp2ref[PT1][Y]);
    printf("\n  -P2: (%lf,%lf)", temp2ref[PT2][X], temp2ref[PT2][Y]);
    printf("\n  -P3: (%lf,%lf)", temp2ref[PT3][X], temp2ref[PT3][Y]);
    printf("\n  -P4: (%lf,%lf)", temp2ref[PT4][X], temp2ref[PT4][Y]);

printf("\n -Digitize summary: digiref");
    printf("\n  -P1: (%lf,%lf)", digiref[PT1][X], digiref[PT1][Y]);
    printf("\n  -P2: (%lf,%lf)", digiref[PT2][X], digiref[PT2][Y]);
    printf("\n  -P3: (%lf,%lf)", digiref[PT3][X], digiref[PT3][Y]);
    printf("\n  -P4: (%lf,%lf)", digiref[PT4][X], digiref[PT4][Y]);
    printf("\n");
    printf("\n -Redigitize (Y/N) ?: ");
    while(toupper((c = getch())) != 'Y' && toupper(c) != 'N')
      ;
    if(toupper(c) == 'N')
      break;
    /* else
```

```
/*****************************************************************
DATA cfgdata - configuration init and save information.

*****************************************************************/
#include "cfg.h"

/*****************************************************************
globals
*****************************************************************/
extern int port;
extern unsigned timeout;
extern double mspd, tspd, pspd;
extern unsigned uptime, downtime;
extern int papsize;
extern double xscale, yscale;

/*****************************************************************
structure definition and initialization
*****************************************************************/
CFG cfgdata[] = {
  { INT, (var *) &port },
  { UNS, (var *) &timeout },
  { DBL, (var *) &mspd },
  { DBL, (var *) &tspd },
  { DBL, (var *) &pspd },
  { UNS, (var *) &uptime },
  { UNS, (var *) &downtime },
  { INT, (var *) &papsize },
  { DBL, (var *) &xscale },
  { DBL, (var *) &yscale }
};
int NUMVARS = sizeof(cfgdata) / sizeof(cfgdata[0]);

/*****************************************************************
MODULE cget -- get parameters for user input.
      returns 0 if no parameter found ('CR' on input or missing).
      returns 1 if parameter found.

FUNCTIONS cgetchr -- return a character.
  cgetstr -- returns a string.
  cgettok -- return a token.
  cgetint -- return an integer.
  cgetdbl -- return a double.

THEORY OF OPERATION

These routines are integer functions which return a boolean value
  depending on whether the argument was found or not.
*****************************************************************/
#include "stdio.h"
#define LINESIZE 80
int cgetchr(pc)
char *pc;
{
  char s[LINESIZE];
  gets(s);
  return(sscanf(s, "%c", pc));    /* return 0 or 1 */
}
```

```
            continue */

/* lets be cleaning up the act */
   clearscr();

} /* big digitizing for loop */

/*******************************************************************
DRILL !!!!
*******************************************************************/
  drillref(&digiref);

/* calculate xformation constants */
  printf("\n -Calculating xformation constants: ");
  xformcon(plotref[PT1][X], plotref[PT1][Y],
           plotref[PT2][X], plotref[PT2][Y],
           plotref[PT3][X], plotref[PT3][Y],
           digiref[PT1][X], digiref[PT1][Y],
           digiref[PT2][X], digiref[PT2][Y],
           digiref[PT3][X], digiref[PT3][Y],
           &_a, &_b, &_c, &_d, &_e, &_f);
  /* lets go back to our beloved caller (some res or drill) */
  return(0);
}
/*******************************************************************
FUNCTION blddril -- build a drill instruction from a coordinate drillir.

*******************************************************************/
#include "stdio.h"
#include "cm3000.h"

/*******************************************************************
FUNCTION DECLARATION
*******************************************************************/
char *blddril(s, ux, uy)
char s[];        /* output buffer */
unsigned ux;     /* x coord */
unsigned uy;     /* y coord */
{
#define CN 24
  static char drill1[] = {CN, 'H', '\0' };
  static char drill2[] = ",";
  static char drill3[] = ";";

char aux[PARMSIZE];           /* buffer for x coord */
  char auy[PARMSIZE];           /* buffer for y coord */ char *stcu_d();    /* convers a double into an integer string */
  int strcat();      /* concatenates strings */
/*******************************************************************
blddril code begins here
*******************************************************************/
  /* initialize s so that concatenation will work properly */
  s[0] = '\0';

/* convert unsigned to unsigned strings */
  stcu_d(aux, ux, PARMSIZE);
  stcu_d(auy, uy, PARMSIZE);
```

```
    /* build the DRILL string */
    strcat(s, drill1);
    strcat(s, aux);
    strcat(s, drill2);
    strcat(s, auy);
    strcat(s, drill3);
    return(s);
}
/*************************************************************************
FUNCTION blddtime -- build an instruction string to alter the pen movement speeds.

*************************************************************************/
#include "stdio.h"
define SPDSIZE 10
define CN 24 char *blddtime(s, down, up)  /* takes down & up drill times and builds time inst
r */
char s[];           /* output buffer for set speed string */
unsigned down;      /* down time */
unsigned up;        /* up time */
{
   static char spd1[] = { CN, 'T', '\0' };
   static char spd2[] = ",";
   static char spd3[] = ";";

char adown[SPDSIZE];        /* buffer for trace speed */
   char aup[SPDSIZE];          /* buffer for move speed */ char *stcu_d();     /* convers a double into an integer string */
   int strcat();       /* concatenates strings */

/* initialize s so that concatenation will work properly */
   s[0] = '\0';

/* convert doubles to integer (truncated) strings */
   stcu_d(adown, (unsigned) (down / 5.0 + 0.5), SPDSIZE);
   stcu_d(aup,   (unsigned) (up   / 5.0 + 0.5), SPDSIZE);

/* build the spped string */
   strcat(s, spd1);
   strcat(s, adown);
   strcat(s, spd2);
   strcat(s, aup);
   strcat(s, spd3);

return(s);
}
/*************************************************************************
FUNCTION bldpa -- build a pa instruction from a coordinate pair.

*************************************************************************/
#include "stdio.h"
#include "cm3000.h"

/*************************************************************************
FUNCTION DECLARATION
*************************************************************************/
char *bldpa(s, ux, uy)
```

```
  char s[];        /* output buffer */
  unsigned ux;     /* x coord */
  unsigned uy;     /* y coord */
{
  static char pa1[] = "PA";
  static char pa2[] = ",";
  static char pa3[] = ";";

char aux[PARMSIZE];        /* buffer for x coord */
  char auy[PARMSIZE];        /* buffer for y coord */ char *stcu_d();   /* convers a double into an integer string */
  int strcat();     /* concatenates strings */
/*****************************************************************
bldpa code begins here
*****************************************************************/
  /* initialize s so that concatenation will work properly */
  s[0] = '\0';

/* convert unsigned to unsigned strings */
  stcu_d(aux, ux, PARMSIZE);
  stcu_d(auy, uy, PARMSIZE);

/* build the PA string */
  strcat(s, pa1);
  strcat(s, aux);
  strcat(s, pa2);
  strcat(s, auy);
  strcat(s, pa3);
  return(s);
}
/*****************************************************************
FUNCTION bldpr -- builds the plot relative instruction strings from
           the xformed offsets.

CAUTION this routine must be called after the board has been digitized
  and xformation constants have been computed.
*****************************************************************/
#include "stdio.h"
#include "cm3000.h"
define void int /*****************************************************************
DECLARATIONS
*****************************************************************/
void bldpr(pr, tdx, tdy, numrad, numpts)
char pr[MAXR][PRSIZE];
int tdx[MAXR][MAXTHETA];
int tdy[MAXR][MAXTHETA];
int numrad;
int numpts;
{
  char *append();
  char sx[PARMSIZE];
  char sy[PARMSIZE];
  char *q;
  static char pr1[] = "PR";
  int i,j;
```

```
/***************************************************************
bldpr code begins here
***************************************************************/
  for(i=0; i<numrad; i++) {
    pr[i][0] = '\0';
    q = pr[i];
    q = append(q, pr1);
    for(j=1; j < numpts; j++) {
      stci_d(sx, tdx[i][j], PARMSIZE);
      stci_d(sy, tdy[i][j], PARMSIZE);
      q = append(q, sx);
      *q++ = ',';
      q = append(q, sy);
      if(j != numpts-1)              /* omit comma on last y coord */
        *q++ = ',';
    }
    *q++ = ';';
    *q   = '\0';
  }
} static char *append(q, r)
char *q;
char *r;
{
  while(*r != '\0')
    *q++ = *r++;
  return(q);
}
/***************************************************************
FUNCTION bldspd -- build an instruction string to alter the pen movement speeds.

***************************************************************/
#include "stdio.h"
define SPDSIZE 10 char *bldspd(s, dspd, mspd)   /* takes draw and move speed and builds set spd */
char s[];          /* output buffer for set speed string */
double dspd;       /* draw speed */
double mspd;       /* move speed */
{
  static char spd1[] = "EM1182;WM3,";
  static char spd2[] = ";WM4,";
  static char spd3[] = ";";

char adspd[SPDSIZE];              /* buffer for trace speed */
  char amspd[SPDSIZE];              /* buffer for move speed */ char *dtoia();     /* convers a double into an integer string */
  int strcat();      /* concatenates strings */

/* initialize s so that concatenation will work properly */
  s[0] = '\0';

/* convert doubles to integer (truncated) strings */
  dtoia(adspd, (dspd * 5.85 + 0.5), SPDSIZE);
  dtoia(amspd, (mspd * 5.85 + 0.5), SPDSIZE);

/* build the spped string */
  strcat(s, spd1);
```

```c
    strcat(s, adspd);
    strcat(s, spd2);
    strcat(s, amspd);
    strcat(s, spd3);

return(s);
}
  gets(s);
  return(sscanf(s, "%lf", pd));   /* return 0 or 1.*/
} int cgetstr(ps)
char *ps;
{
  char s[LINESIZE];

gets(s);
  if(s[0] == '\0')      /* if Enter by itself, keep old string */
    return(0);
  else {                /* otherwise, copy new string */
    strcpy(ps, s);
    return(1);
  }
} int cgettok(ps)
char *ps;
{
  char s[LINESIZE];

gets(s);
  return(sscanf(s, "%s", ps));   /* return 0 or 1 */
} int cgetint(pi)
int *pi;
{
  char s[LINESIZE];

gets(s);
  return(sscanf(s, "%d", pi));   /* return 0 or 1 */
} int cgetdbl(pd)
double *pd;
{
  char s[LINESIZE];

gets(s);
  return(sscanf(s, "%lf", pd));   /* return 0 or 1.*/

/*******************************************************************
FUNCTION clearscr -- clears the screen.

CAUTION

This implementation is VERY MS-DOS dependent.
  (Therefore NOT portable).

*******************************************************************/
```

```
#include "stdio.h"
define void int void clearscr()
{
  system("CLS");
}

/************************************************************
FUNCTION config -- call configuration menu.

*************************************************************/
#define void int
#include "stdio.h"
#include "menul.h"

/************************************************************
EXTERNALS
*************************************************************/
extern MENU1 cmmenu1;

void config(path)
char *path;
{
  menu1a(path, &cmmenu1);
}
```

What is claimed is:

1. A process for use in the production of a printed circuit board utilizing a computer and a computer controlled plotter, comprising:
   retaining a conductive sheet-clad board in the plotter while performing the following activities on the conductive sheet,
   applying resist by capillary effect directly to the conductive sheet from a marking device manipulated by the plotter, and
   creating a predetermined printed circuit pattern of resist on the conductive sheet by controlling the plotter to move the marking device relative to a stationary reference and relative to the board.

2. A process as defined in claim 1 wherein the plotter is controlled by the computer, and the computer has a memory containing information defining the predetermined printed circuit pattern, and the computer controls the plotter to create the predetermined printed circuit pattern of resist on the conductive sheet.

3. A process as defined in claim 2 wherein the printed circuit pattern of applied resist includes a plurality of lines of resist, and at least two of the lines of resist have different widths.

4. A process as defined in claim 3 wherein the marking device has a marking point which applies resist to the conductive sheet in a line of predetermined width, and wherein at least one conductor of the circuit pattern is greater in width than the width of the line applied by the marking device, and further comprising:
   applying resist on the conductive sheet to define the conductor by applying a series of generally parallel, transversely offset and adjoining lines of resist from the marking device, under the control of the computer.

5. A process as defined in claim 4 further comprising:
   overlapping each of the series of generally parallel lines of resist by a predetermined amount related to the width of the line of resist applied from the marking device and related to the width of the conductor, under control of the computer.

6. A process as defined in claim 2 wherein the resist material is applied in at least one connector pad ring, and a center of the ring is devoid of applied resist.

7. A process as defined in claim 6 wherein the ring of resist is defined by a plurality of concentric and radially offset circular lines of resist which radially adjoin one another.

8. A process as defined in claim 2 wherein the information in the memory of the computer also includes information defining the speed at which the marking device can move relative to the conductive sheet in order to obtain a predetermined degree of capillary effect fluid flow of the resist onto the conductive sheet, and further comprising:
   controlling the speed of movement of the marking device relative to the conductive sheet to obtain the predetermined desired capillary effect fluid flow of the resist on the conductive sheet.

9. A process for use in the production of a printed circuit board utilizing a computer and a plotter controlled by the computer, the computer having a memory containing information defining a predetermined printed circuit pattern, the computer controlling the plotter to create the predetermined printed circuit pattern, and the plotter including a carrier mechanism which retains a pen, comprising:

retaining a conductive sheet-clad board in the plotter while performing the following activities on the board, applying resist directly on the conductive sheet from at least two marking devices manipulated by the plotter, each marking device comprising a pen having a marking point which applies resist to the conductive sheet in a line of predetermined width, the width of the resist line applied by one pen being different than the width of the resist line applied by the other pen, holding the pen in the carrier mechanism, moving the carrier mechanism to apply resist from the pen onto the conductive sheet, applying resist in a line of one width with one pen held in the carrier mechanism, transferring the one pen from the carrier mechanism and thereafter transferring the other pen to the carrier mechanism, accomplishing both transferring steps automatically under the control of the computer, and applying resist in a line of another width with the other pen held in the carrier mechanism.

10. A process for use in the production of a printed circuit board utilizing a computer and a plotter controlled by the computer, the computer having a memory containing information defining a predetermined printed circuit pattern, the computer controlling the plotter to create the predetermined circuit pattern, the plotter including a carrier mechanism which selectively holds an instrument useful in the process, one such instrument being a marking device and another such instrument being a hole drilling instrument, the process comprising:

retaining a conductive sheet-clad board in the plotter while performing the following activities on the board, applying etchant resist directly to the conductive sheet from the marking device manipulated by the carrier mechanism of the plotter, creating the predetermined circuit pattern of resist on the conductive sheet by controlling the plotter to move the marking device and the board relative to one another, and drilling a hole through the board by use of the hole drilling instrument held in the carrier mechanism under the control of the computer.

11. A process as defined in claim 10 further comprising:

transferring the marking device from the carrier mechanism after applying the resist, and thereafter transferring the hole drilling instrument to the carrier mechanism prior to drilling the hole, and automatically accomplishing both transfers under the control of the computer.

12. A process as defined in claim 11 further comprising:

drilling each of a plurality of holes in the board by use of a hole drilling instrument held by the carrier mechanism, at least two of the holes having a different diameter or cross sectional size, using one hole drilling instrument to drill a hole of one size in the board, and using another hole drilling instrument to drill a hole of a different size in the board.

13. A process as defined in claim 12 wherein each hole drilling instrument comprises a drill motor having a drill bit attached thereto.

14. A process as defined in claim 12 further comprising:

controlling the selection of the one and the another hole drilling instruments under the control of the computer.

15. A process as defined in claim 11 further comprising:

carrying drill particles created by drilling the board away from the plotter in a stream of air.

16. A process as defined in claim 15 wherein the stream of air is created by a low pressure vacuum source.

17. A process as defined in claim 16 further comprising:

selectively creating the stream of air under the control of the computer prior to drilling a hole into the board.

18. A process as defined in claim 15 wherein the stream of air is created by a vacuum device having a low pressure inlet and a high pressure outlet, the high and low pressures being relative to ambient pressure, and further comprising:

attaching an air supply plenum and a vacuum plenum to the plotter, connecting the air supply plenum to the outlet of the vacuum device, connecting the vacuum supply plenum to the inlet of the vacuum device, and arranging the plenums to create a stream of air across the conductive sheet when drilling the hole.

19. A process as defined in claim 11 further comprising establishing the orientation of the board as retained in the plotter by steps comprising:

holding an optical sight instrument in the carrier mechanism, and aligning a reference location on the board with an optical axis through the optical sight instrument by controlling the plotter to create relative movement between the optical sight instrument held in the carrier mechanism and the board until optical alignment occurs.

20. A process as defined in claim 19 further comprising:

removing the board from the plotter for etching after the printed circuit pattern of resist has been applied and before drilling the hole through the board at a location in the printed circuit pattern, again retaining the board in the plotter after etching, establishing the orientation of the board in the manner aforesaid by using the optical sight instrument, and thereafter drilling a hole through the board by using the hole drilling instrument held in the carrier mechanism.

21. A process as defined in claim 20 wherein the board has two parallel conductive sheets attached on opposite sides of a flat substrate, and the process further comprises:

removing the board after applying the resist in the printed circuit pattern on a first conductive sheet of the board, retaining the board in the plotter in a second instance with the other conductive sheet in position for applying resist thereto, establishing the orientation of the board in the plotter in the second instance by using the optical site instrument in the manner aforesaid, applying resist in a second predetermined printed circuit pattern on the other conductive sheet by controlling the plotter and the carrier mechanism holding the marking device in the manner aforesaid, and locating portions of the second printed circuit pattern in side to side alignment on the board to orient opposite portions which are to be drilled through an substantial orthogonal alignment with respect to the planes of the conductive sheets.

22. A process as defined in claim 21 wherein at least two of the portions to be drilled through are conductor pad rings substantially coaxially positioned on opposite sides of the board about an axis orthogonal to the planes of the conductor sheets.

23. A process as defined in claim 22 wherein the center of each conductor pad ring of resist is devoid of resist.

24. A process as defined in claim 23 further comprising:
etching the board after applying the resist, and
drilling a hole through the centers of the conductor ring pads of conductive sheet material which are in orthogonal alignment on opposite sides of the board.

25. A process as defined in claim 21 wherein at least two of the portions to be drilled through are conductor ring pads of resist having a center portion devoid of resist and located on opposite sides of the board, each center portion being substantially coaxially positioned about an axis orthogonal to the planes of the conductor sheets.

26. A process as defined in claim 21 wherein the plotter includes a carousel for holding instruments and for transfering the instruments to the carrier mechanism, the carousel holding at least one marking device instrument and at least one hole drilling instrument, and the process further comprising:
transfering one type of instrument from the carrier mechanism to the carousel, and thereafter
transfering another type of instrument from the carousel to the carrier mechanism during the aforesaid process, and
automatically accomplishing all transfers under the control of the computer.

27. A process as defined in claim 26 wherein the carousel further holds at least one optical sight instrument.

28. A process as defined in claim 21 wherein the step of locating portions of the second printed circuit pattern further comprises:
drilling at least one locating hole in the circuit board prior to applying the resist in the second printed circuit pattern to the second side of the circuit board.

29. A process as defined in claim 10 wherein the step of retaining the conductive sheet clad board in the plotter further comprises:
attaching the board to a carrier sheet, and
retaining the carrier sheet in the plotter for movement by the plotter.

30. A process for use in the production of printed circuit boards utilizing a computer and a computer controlled plotter, comprising:
retaining a printed circuit board having an undrilled predetermined printed circuit pattern of conductors formed thereon in the plotter for movement by the plotter, establishing the orientation of the predetermined printed circuit pattern of conductors in relation to the retention of the board by the plotter under the control of the computer, by holding a locating device in the plotter, by moving the locating device relative to at least three predetermined locating points on the board to position the locating device at a predetermined location with respect to each locating point, and by utilizing information defining each predetermined location of the three locating points established by positioning the locating device, holding a hole drilling device in the plotter, moving the hole drilling device relative to the printed circuit pattern while held by the plotter to position the hole drilling device to drill holes at predetermined hole locations, and drilling holes through the printed circuit pattern and the board at predetermined hole locations by using the hole drilling device held in the plotter under the control of the computer.

31. A process as defined in claim 30 further comprising:
locating the predetermined locations for the holes by moving the hole drilling device relative to the printed circuit pattern under the control of the computer after the orientation of the printed circuit pattern has been established.

32. A process as defined in claim 31 further comprising:
carrying drill particles created by drilling the board away from the plotter in a stream of air moving across the board.

33. A process as defined in claim 30 further comprising:
automatically transferring the locating device from the plotter and the hole drilling device to the plotter after the orientation of the printed circuit pattern has been established.

34. A process for use in the production of printed circuit boards utilizing a computer and a computer controlled plotter, the plotter including a carrier mechanism which retains an instrument useful in the process, one such instrument being a hole drilling device, comprising:
retaining a printed circuit board having an undrilled predetermined printed circuit pattern of conductors formed thereon in the plotter for movement by the plotter, establishing the orientation of the predetermined printed circuit pattern of conductors in relation to the retention of the board by the plotter, holding the hole drilling device in the carrier mechanism, moving the hole drilling device held in the carrier mechanism under the control of the computer to position the hole drilling device to drill holes in the undrilled printed circuit pattern at predetermined hole locations, the predetermined location of each hole to be drilled being established by manipulating the carrier mechanism and the printed circuit board relative to one another under the control of the computer, the computer having a memory which includes information defining the predetermined printed circuit pattern and the location of each hole to be drilled relative to the printed circuit pattern, and drilling holes through the printed circuit pattern and the board at predetermined hole locations by using the hole drilling device held in the carrier mechanism under the control of the computer.

35. A process as defined in claim 34 wherein at least a plurality of holes are drilled in the printed circuit board and at least two of the holes drilled are of a different diameter of cross sectional sizes.

36. A process as defined in claim 35 using a plurality of hole drilling devices, each hole drilling device including a drill motor having a drill bit attached thereto, at least two of the drill motors having drill bits of different diameters or cross sectional sizes, and the process further comprises:

using one drill motor having a drill bit of one size to drill a hole of one size in the board, and using another drill motor having a drill bit of another size to drill a different hole of a different size in the board.

37. A process as defined in claim 36 further comprising:

substituting one drill motor and attached drill bit on the carrier mechanism for the other drill motor and attached drill bit when the holes of different sizes are drilled.

38. A process as defined in claim 37 wherein the plotter includes means for transferring selected instruments to and from the carrier mechanism, and at least two of such selected instruments available for transfer to the carrier mechanism are the two drill motors which each have a different sized drill bit attached thereto, and the process further comprises:

transferring one drill motor with the attached drill bit to the carrier mechanism and thereafter drilling a hole of one size in the board, and thereafter transferring the one drill motor from the carrier mechanism, and thereafter transferring the other drill motor and the attached drill bit to the carrier mechanism, and thereafter drilling the different hole of the different size in the board, and accomplishing all the transfers under the control of the computer.

39. A process as defined in claim 38 further comprising:

coupling operative energy from the carrier mechanism to the drill motor for operating the drill motor.

40. A process as defined in claim 39 further comprising:

establishing a selective mechanical connection to the drill motor after it has been transferred to the carrier mechanism to supply the operative energy to the drill motor, and selectively terminating the mechanical connection to the drill motor prior to transferring the drill motor from the carrier mechanism.

41. A process as defined in claim 40 further comprising:

orienting a drill bit of the hole drilling device orthogonal to the plane of the printed circuit board prior to drilling the hole.

42. A process as defined in claim 41 further comprising:

advancing the drill bit axially along an axis orthogonal to the printed circuit board after the orthogonal orientation has been established.

43. A process as defined in claim 42 further comprising:

accomplishing under the control of the computer the steps of orienting the drill bit orthogonal to the plane of the printed circuit board and advancing the drill bit.

44. A process as defined in claim 34 wherein the drill particles are removed by vacuuming the drill particles away from the plotter.

45. A process as defined in claim 34 wherein the drill particles are removed by steps comprising:

carrying the drill particles away from the plotter in a stream of air.

46. A process as defined in claim 45 wherein the stream of air is created by directing a high pressure source of air toward the hole from one direction and pulling air and the drill particles from the hole in the opposite direction by a vacuum source.

47. A process as defined in claim 45 further comprising:

creating the stream of air under the control of the computer.

48. A process for use in the production of a printed circuit board utilizing a computer and a computer controlled plotter, comprising:

establishing at least three locating points on a board from which the printed circuit board is to be produced, retaining the board in the plotter for manipulation, locating each of the three locating points by manipulating a locating device of the plotter and the board relative to one another until a reference axis of the locating device is located in a predetermined position with respect to each locating point, and establishing the orientation of the board retained in the plotter from information obtained from locating all three locating points.

49. A process as defined in claim 48 further comprising:

establishing the side of the board upon which operative effects are to be achieved by the information obtained from locating of all three locating points.

50. A process as defined in claim 49 wherein the locating points are holes formed in the board.

51. A process as defined in claim 50 wherein the locating holes are formed in the board prior to retaining the board in the plotter.

52. A process as defined in claim 50 wherein the locating holes are formed in the board after the board is retained in the plotter.

53. A process as defined in claim 48 wherein the computer includes a memory containing information defining a predetermined pattern of printed circuit conductors to be formed on the board, and further comprising:

establishing a working area on the board within which the predetermined pattern of printed circuit conductors is to be formed, under the control of the computer and using information obtained by locating each of the three locating points.

54. A process as defined in claim 53 further comprising:

orienting the working area under the control of the computer by using the information contained in the memory defining the predetermined pattern of printed circuit conductors and by using the information obtained by locating each locating point.

55. A process as defined in claim 54 further comprising:

proportioning the size of the predetermined pattern of printed circuit conductors to fit within the working area established, automatically under the control of information contained in the memory of the computer.

* * * * *